(12) United States Patent
Britt et al.

(10) Patent No.: US 9,362,433 B2
(45) Date of Patent: Jun. 7, 2016

(54) PHOTOVOLTAIC INTERCONNECT SYSTEMS, DEVICES, AND METHODS

(71) Applicants: Global Solar Energy, Inc., Tucson, AZ (US); Hanergy Hi-Tech Power (HK) Limited, West KL (HK)

(72) Inventors: Jeffrey S. Britt, Tucson, AZ (US); Scott Wiedeman, Tucson, AZ (US)

(73) Assignee: Hanergy Hi-Tech Power (HK) Limited, West KL (HK)

( * ) Notice: Subject to any disclaimer, the term of this patent is extended or adjusted under 35 U.S.C. 154(b) by 114 days.

(21) Appl. No.: 14/166,223

(22) Filed: Jan. 28, 2014

(65) Prior Publication Data

US 2014/0213013 A1     Jul. 31, 2014

Related U.S. Application Data

(60) Provisional application No. 61/757,636, filed on Jan. 28, 2013.

(51) Int. Cl.
| | | |
|---|---|---|
| *H01L 21/00* | (2006.01) | |
| *H01L 31/046* | (2014.01) | |
| *H01L 31/0392* | (2006.01) | |
| *H01L 31/05* | (2014.01) | |
| *H01L 31/048* | (2014.01) | |

(52) U.S. Cl.
CPC .......... *H01L 31/046* (2014.12); *H01L 31/0392* (2013.01); *H01L 31/0508* (2013.01); *H01L 31/0512* (2013.01); *H01L 31/0488* (2013.01); *Y02E 10/50* (2013.01)

(58) Field of Classification Search
None
See application file for complete search history.

(56) References Cited

U.S. PATENT DOCUMENTS

| | | |
|---|---|---|
| 3,553,030 A | 1/1971 | Lebrun |
| 4,064,552 A | 12/1977 | Angelucci et al. |
| 4,221,465 A | 9/1980 | Hannan et al. |
| 4,254,546 A | 3/1981 | Ullery, Jr. |
| 4,318,938 A | 3/1982 | Barnett et al. |
| 4,400,577 A | 8/1983 | Spear |
| 4,430,519 A | 2/1984 | Young |
| 4,537,838 A | 8/1985 | Jetter et al. |
| 4,542,255 A | 9/1985 | Tanner et al. |
| 4,609,770 A | 9/1986 | Nishiura et al. |
| 4,617,420 A | 10/1986 | Dilts et al. |

(Continued)

FOREIGN PATENT DOCUMENTS

| | | |
|---|---|---|
| DE | 3423172 A1 | 1/1985 |
| DE | 19652810 A1 | 7/1998 |

(Continued)

OTHER PUBLICATIONS

Oct. 30, 2014, International Preliminary Report on Patentability from The International Bureau of WIPO, in PCT/US2013/037024, which is an international patent application of Hanergy Hi-Tech Power (HK) Limited.

(Continued)

*Primary Examiner* — Angel Roman
(74) *Attorney, Agent, or Firm* — Kolisch Hartwell, P.C.

(57) ABSTRACT

Photovoltaic modules may include multiple flexible thin film photovoltaic cells electrically connected in series by a substantially transparent top sheet having an embedded conductive wire grid pattern. Methods of manufacturing photovoltaic modules including integrated multi-cell interconnections are provided.

20 Claims, 15 Drawing Sheets

(56) References Cited

U.S. PATENT DOCUMENTS

| | | |
|---|---|---|
| 4,617,421 A | 10/1986 | Nath et al. |
| 4,642,413 A | 2/1987 | Ovshinsky |
| 4,652,693 A | 3/1987 | Bar-On |
| 4,663,828 A | 5/1987 | Hanak |
| 4,663,829 A | 5/1987 | Hartman et al. |
| 4,697,041 A | 9/1987 | Okaniwa et al. |
| 4,698,455 A | 10/1987 | Cavicchi et al. |
| 4,713,493 A | 12/1987 | Ovshinsky |
| 4,737,379 A | 4/1988 | Hudgens et al. |
| 4,746,618 A | 5/1988 | Nath et al. |
| 4,773,944 A | 9/1988 | Nath et al. |
| 4,783,421 A | 11/1988 | Carlson et al. |
| 4,965,655 A | 10/1990 | Grimmer et al. |
| 5,021,099 A | 6/1991 | Kim et al. |
| 5,118,361 A | 6/1992 | Fraas et al. |
| 5,127,964 A | 7/1992 | Hamakawa et al. |
| 5,176,758 A | 1/1993 | Nath et al. |
| 5,181,968 A | 1/1993 | Nath et al. |
| 5,185,042 A | 2/1993 | Ferguson |
| 5,254,179 A | 10/1993 | Ricaud et al. |
| 5,268,037 A | 12/1993 | Glatfelter |
| 5,273,608 A | 12/1993 | Nath |
| 5,385,848 A | 1/1995 | Grimmer |
| 5,391,235 A | 2/1995 | Inoue |
| 5,409,549 A | 4/1995 | Mori |
| 5,419,781 A | 5/1995 | Hamakawa et al. |
| 5,457,057 A | 10/1995 | Nath et al. |
| 5,460,659 A | 10/1995 | Krut |
| 5,474,621 A | 12/1995 | Barnard |
| 5,534,094 A | 7/1996 | Arjavalingam et al. |
| 5,547,516 A | 8/1996 | Luch |
| 5,728,230 A | 3/1998 | Komori et al. |
| 5,735,966 A | 4/1998 | Luch |
| 5,928,437 A | 7/1999 | Dillard |
| 6,148,570 A | 11/2000 | Dinwoodie et al. |
| 6,239,352 B1 | 5/2001 | Luch |
| 6,248,948 B1 | 6/2001 | Nakagawa et al. |
| 6,310,281 B1 | 10/2001 | Wendt et al. |
| 6,372,538 B1 | 4/2002 | Wendt et al. |
| 6,414,235 B1 | 7/2002 | Luch |
| 6,459,032 B1 | 10/2002 | Luch |
| 6,479,744 B1 | 11/2002 | Tsuzuki et al. |
| 6,653,718 B2 | 11/2003 | Leung et al. |
| 6,690,041 B2 | 2/2004 | Armstrong et al. |
| 6,706,963 B2 | 3/2004 | Gaudiana et al. |
| 7,122,398 B1 | 10/2006 | Pichler |
| 7,176,543 B2 | 2/2007 | Beernink |
| 7,194,197 B1 | 3/2007 | Wendt et al. |
| 7,256,140 B2 | 8/2007 | Call et al. |
| 7,365,266 B2 | 4/2008 | Heckeroth |
| 7,432,438 B2 | 10/2008 | Rubin et al. |
| 7,485,474 B2 | 2/2009 | Call et al. |
| 7,498,508 B2 | 3/2009 | Rubin et al. |
| 7,507,903 B2 | 3/2009 | Luch |
| 7,517,465 B2 | 4/2009 | Guha et al. |
| 7,612,283 B2 | 11/2009 | Toyomura et al. |
| 7,635,810 B2 | 12/2009 | Luch |
| 7,638,353 B2 | 12/2009 | Beernink et al. |
| 7,732,243 B2 | 6/2010 | Luch |
| 7,851,700 B2 | 12/2010 | Luch |
| 7,868,249 B2 | 1/2011 | Luch |
| 7,898,053 B2 | 3/2011 | Luch |
| 7,898,054 B2 | 3/2011 | Luch |
| 7,932,124 B2 | 4/2011 | Brabec et al. |
| 7,964,476 B2 | 6/2011 | Liu et al. |
| 7,989,692 B2 | 8/2011 | Luch |
| 7,989,693 B2 | 8/2011 | Luch |
| 8,062,922 B2 | 11/2011 | Britt et al. |
| 8,076,568 B2 | 12/2011 | Luch et al. |
| 8,110,737 B2 | 2/2012 | Luch |
| 8,114,702 B2 | 2/2012 | Gilman |
| 8,138,413 B2 | 3/2012 | Luch et al. |
| 8,198,696 B2 | 6/2012 | Luch |
| 8,202,368 B2 | 6/2012 | Britt et al. |
| 8,222,513 B2 | 7/2012 | Luch |
| 8,304,646 B2 | 11/2012 | Luch |
| 8,319,097 B2 | 11/2012 | Luch |
| 8,759,664 B2 | 6/2014 | Kanto et al. |
| 8,956,888 B2 | 2/2015 | Shufflebotham |
| 8,993,364 B2 | 3/2015 | Wiedeman et al. |
| 2001/0015220 A1 | 8/2001 | Benz et al. |
| 2003/0213974 A1 | 11/2003 | Armstrong et al. |
| 2004/0069340 A1 | 4/2004 | Luch |
| 2005/0000561 A1 | 1/2005 | Baret et al. |
| 2005/0121067 A1 | 6/2005 | Toyomura et al. |
| 2005/0176270 A1 | 8/2005 | Luch |
| 2005/0284517 A1 | 12/2005 | Shinohara |
| 2006/0032752 A1 | 2/2006 | Luch |
| 2006/0157103 A1 | 7/2006 | Sheats et al. |
| 2006/0174930 A1 | 8/2006 | Murphy et al. |
| 2006/0180195 A1 | 8/2006 | Luch |
| 2007/0095384 A1 | 5/2007 | Farquhar et al. |
| 2007/0253686 A1 | 11/2007 | Wendt et al. |
| 2007/0283996 A1 | 12/2007 | Hachtmann et al. |
| 2007/0283997 A1 | 12/2007 | Hachtmann et al. |
| 2008/0011350 A1 | 1/2008 | Luch |
| 2008/0023069 A1 | 1/2008 | Terada et al. |
| 2008/0053512 A1 | 3/2008 | Kawashima |
| 2008/0090022 A1 | 4/2008 | Ovshinsky |
| 2008/0099063 A1 | 5/2008 | Armstrong et al. |
| 2008/0121265 A1 | 5/2008 | Hishida et al. |
| 2008/0128013 A1 | 6/2008 | Lopatin et al. |
| 2008/0202577 A1 | 8/2008 | Hieslmair |
| 2008/0227236 A1 | 9/2008 | Luch |
| 2008/0257399 A1 | 10/2008 | Wong et al. |
| 2008/0314433 A1 | 12/2008 | Luch |
| 2009/0014058 A1 | 1/2009 | Croft et al. |
| 2009/0107538 A1 | 4/2009 | Luch |
| 2009/0111206 A1 | 4/2009 | Luch |
| 2009/0145551 A1 | 6/2009 | Luch |
| 2009/0169722 A1 | 7/2009 | Luch |
| 2009/0173374 A1 | 7/2009 | Luch |
| 2009/0223552 A1 | 9/2009 | Luch |
| 2009/0255469 A1 | 10/2009 | Britt et al. |
| 2009/0255565 A1 | 10/2009 | Britt et al. |
| 2009/0269877 A1 | 10/2009 | Pinarbasi et al. |
| 2009/0272436 A1 | 11/2009 | Cheung |
| 2009/0293941 A1 | 12/2009 | Luch |
| 2009/0314330 A1 | 12/2009 | Saha et al. |
| 2010/0108118 A1 | 5/2010 | Luch |
| 2010/0131108 A1 | 5/2010 | Meyer |
| 2010/0147356 A1 | 6/2010 | Britt |
| 2010/0193367 A1 | 8/2010 | Luch |
| 2010/0218824 A1 | 9/2010 | Luch |
| 2010/0224230 A1 | 9/2010 | Luch et al. |
| 2010/0229942 A1 | 9/2010 | Luch |
| 2010/0269902 A1 | 10/2010 | Luch et al. |
| 2010/0313946 A1 | 12/2010 | Higuchi et al. |
| 2011/0056537 A1 | 3/2011 | Luch |
| 2011/0067754 A1 | 3/2011 | Luch |
| 2011/0070678 A1 | 3/2011 | Luch |
| 2012/0000502 A1 | 1/2012 | Wiedeman et al. |
| 2012/0000510 A1 | 1/2012 | Wiedeman et al. |
| 2012/0006378 A1 | 1/2012 | Kanto et al. |
| 2012/0171802 A1 | 7/2012 | Luch et al. |
| 2012/0322194 A1 | 12/2012 | Luch |
| 2013/0037074 A1 | 2/2013 | Britt et al. |
| 2013/0052769 A1 | 2/2013 | Luch |
| 2013/0240011 A1 | 9/2013 | Luch |
| 2013/0255744 A1 | 10/2013 | Luch |
| 2013/0255746 A1 | 10/2013 | Luch et al. |
| 2013/0255771 A1 | 10/2013 | Luch |
| 2013/0269748 A1 | 10/2013 | Wiedeman et al. |
| 2014/0137928 A1 | 5/2014 | Wiedeman et al. |
| 2014/0170798 A1 | 6/2014 | Wiedeman et al. |

FOREIGN PATENT DOCUMENTS

| | | |
|---|---|---|
| DE | 19814780 A1 | 7/1999 |
| DE | 212009000025 U1 | 10/2010 |
| DE | 102009020482 A1 | 11/2010 |
| EP | 0111394 A2 | 6/1984 |
| JP | 51-110985 A | 9/1976 |
| WO | 2005077062 A2 | 8/2005 |

(56) References Cited

FOREIGN PATENT DOCUMENTS

| WO | 2009006230 A2 | 1/2009 |
|----|---------------|--------|
| WO | 2009097161 A1 | 8/2009 |
| WO | 2010039245 A1 | 4/2010 |
| WO | 2011090723 A2 | 7/2011 |
| WO | 2013158796 A1 | 10/2013 |

OTHER PUBLICATIONS

May 14, 2014, International Search Report of the International Search Authority from the U.S. Receiving Office, in PCT/US2014/013348, which is an international application of Applicant Hanergy Hi-Tech Power (HK) Limited.
May 14, 2014, Written Opinion of the International Search Authority from the U.S. Receiving Office, in PCT/US2014/013348, which is an international application of Applicant Hanergy Hi-Tech Power (HK) Limited.
Sep. 15, 2014, Extended European Search Report from the European Patent Office, in European Patent Application No. 10844268.2, which is another application of Applicant Hanergy Hi-Tech Power (HK) Limited.
May 14, 2014, International Search Report of he International Search Authority from The U.S. Receiving Office, in PCT/US2014/013348, which is the international application to this U.S. application.
May 14, 2014, Written Opinion of the International Search Authority from The U.S. Receiving Office, in PCT/US2014/013348, which is the international application to this U.S. application.
Schwertheim et al., "Lead-free electrical conductive adhesives for solar cell interconnectors," Aug. 29, 2008, received from http://www.ferrnunihagen.de/LGBE/papers/2007/revpaper.pdf on Dec. 7, 2009, 3 pages.
Apr. 3, 2009, International Search Report and Written Opinion of the International Searching Authority from the U.S. Receiving Office, in PCT/US2009/000690, which is an international patent application of Global Solar Energy, Inc., 8 pages.
Dec. 17, 2009, International Search Report and Written Opinion of the International Searching Authority from the U.S. Receiving Office, in PCT/US2009/005418, which is an international patent application of Global Solar Energy, Inc., 7 pages.
Aug. 3, 2010, International Preliminary Report on Patentability from the International Bureau of WIPO, in PCT/US2009/000690, which is an international patent application of Global Solar Energy, Inc., 7 pages.
Mar. 29, 2011, International Search Report and Written Opinion of the International Searching Authority from the U.S. Receiving Office, in PCT/US2010/062253, which is an international patent application of Global Solar Energy, Inc., 12 pages.
Apr. 5, 2011, Office action from the U.S. Patent and Trademark Office, in U.S. Appl. No. 12/364,440, which is another patent application of Global Solar Energy, Inc., 17 pages.
Apr. 5, 2011, International Preliminary Report on Patentability from The International Bureau of WIPO, in PCT/US2009/005418, which is an international patent application of Global Solar Energy, Inc., 6 pages.
Nov. 29, 2011, Office action from the U.S. Patent and Trademark Office, in U.S. Appl. No. 12/364,440, which is another patent application of Global Solar Energy, Inc., 18 pages.
May 2, 2012, International Search Report and Written Opinion of the International Searching Authority from the U.S. Receiving Office, in PCT/US2010/062259, which is an international patent application of Global Solar Energy, Inc., 16 pages.
Jul. 4, 2012, International Preliminary Report on Patentability from The International Bureau of WIPO, in PCT/US2010/062253, which is an international patent application of Global Solar Energy, Inc., 8 pages.
Jul. 4, 2012, International Preliminary Report on Patentability from The International Bureau of WIPO, in PCT/US2010/062259, which is an international patent application of Global Solar Energy, Inc., 12 pages.
Aug. 28, 2012, Office action from the U.S. Patent and Trademark Office, in U.S. Appl. No. 12/587,111, which is another patent application of Global Solar Energy, Inc., 20 pages.
Dec. 6, 2012, Office action from the U.S. Patent and Trademark Office, in U.S. Appl. No. 12/980,201, which is another patent application of Global Solar Energy, Inc., 20 pages.
Dec. 13, 2012, Office action from the U.S. Patent and Trademark Office, in U.S. Appl. No. 12/980,151, which is another patent application of Global Solar Energy, Inc., 25 pages.
Jan. 9, 2013, Office action from the U.S. Patent and Trademark Office, in U.S. Appl. No. 12/976,911, which is another patent application of Global Solar Energy, Inc., 23 pages.
Mar. 14, 2013, Office action from the U.S. Patent and Trademark Office, in U.S. Appl. No. 12/587,111, which is another patent application of Global Solar Energy, Inc., 21 pages.
Jul. 5, 2013, Office action from the U.S. Patent and Trademark Office, in U.S. Appl. No. 12/976,911, which is another patent application of Global Solar Energy, Inc., 13 pages.
Jul. 15, 2013, Office action from the U.S. Patent and Trademark Office, in U.S. Appl. No. 12/980,201, which is another patent application of Global Solar Energy, Inc., 25 pages.
Jul. 31, 2013, Office action from the U.S. Patent and Trademark Office, in U.S. Appl. No. 12/980,151, which is another patent application of Global Solar Energy, Inc., 19 pages.
Aug. 13, 2013, International Search Report and Written Opinion of the International Searching Authority from the U.S. Receiving Office, in PCT/US2013/037024, which is an international patent application of Global Solar Energy, Inc., 13 pages.
Dec. 24, 2013, Office action from the U.S. Patent and Trademark Office, in U.S. Appl. No. 13/482,699, which is another patent application of Global Solar Energy, Inc., 31 pages.
Unpublished U.S. Appl. No. 14/151,040, which is another patent application of Global Solar Energy, Inc.
Aug. 6, 2015, International Preliminary Report on Patentability from The International Bureau of WIPO, in PCT/US2014/013348, which is the international application to this U.S. application.
Sep. 23, 2015, Office action from the U.S. Patent and Trademark Office, in U.S. Appl. No. 14/671,937, which is another application of Applicant Hanergy Hi-Tech Power (HK) Limited.
Oct. 30, 2015, Extended European Search Report from the European Patent Office, in European Patent Application No. 13777853.6, which is a foreign patent application of Applicant Hanergy Hi-Tech Power (HK) Limited.
Jun. 17, 2015, Examination Report from the European Patent Office, in European Patent Application No. 108442682, which is another application of Applicant Hanergy Hi-Tech Power (HK) Limited.
Apr. 4, 2016, Office action from the U.S. Patent and Trademark Office, in U.S. Appl. No. 13/865,099, which is another application of Applicant Hanergy Hi-Tech Power (HK) Limited.
Jan. 26, 2016, Office action from the U.S Patent and Trademark Office, in U.S. Appl. No. 14/932,059, which is another application of Applicant Hanergy Hi-Tech Power (HK) Limited.

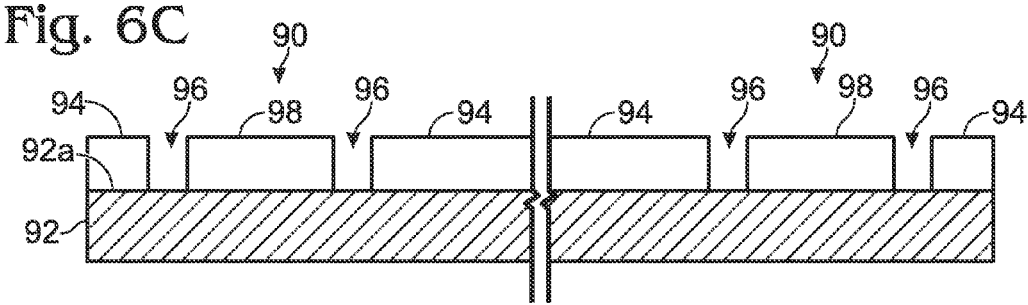
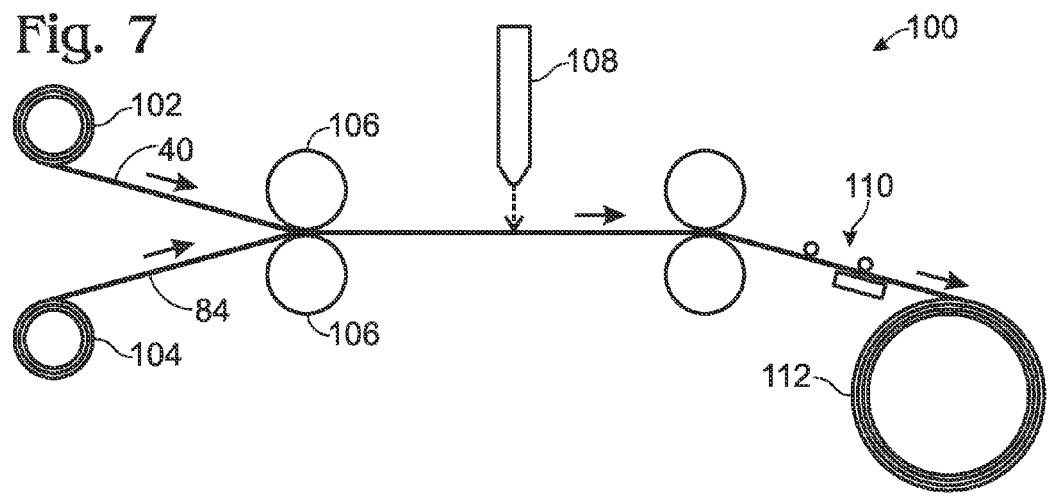
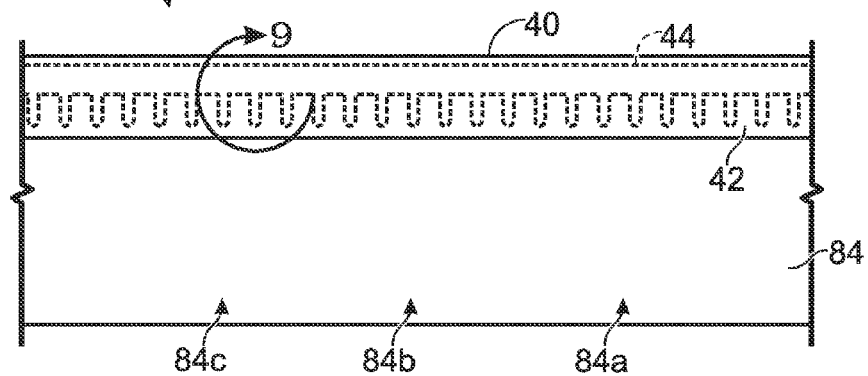

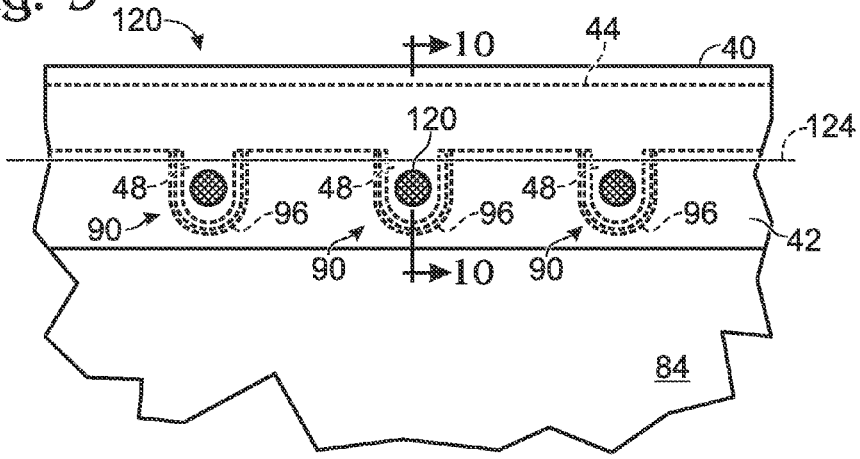
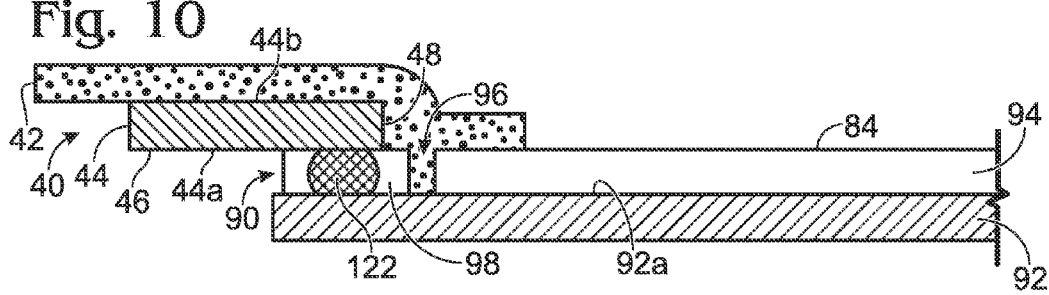
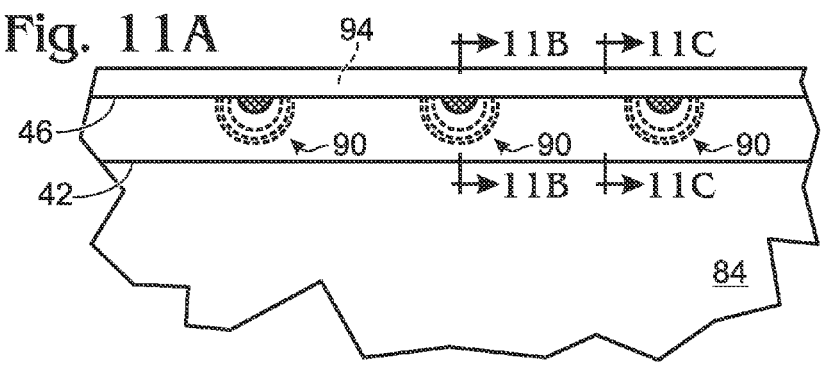
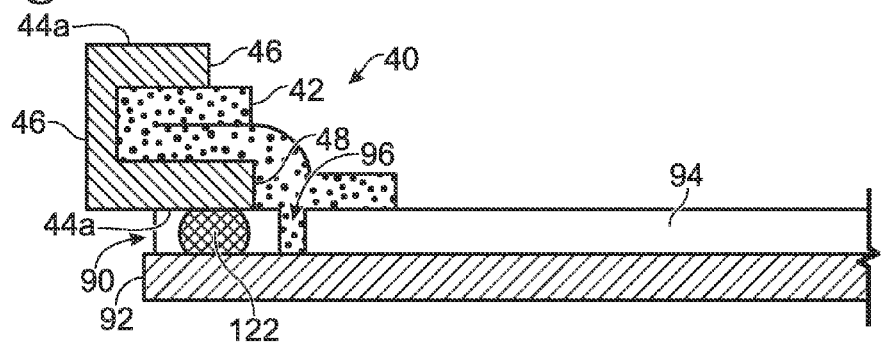

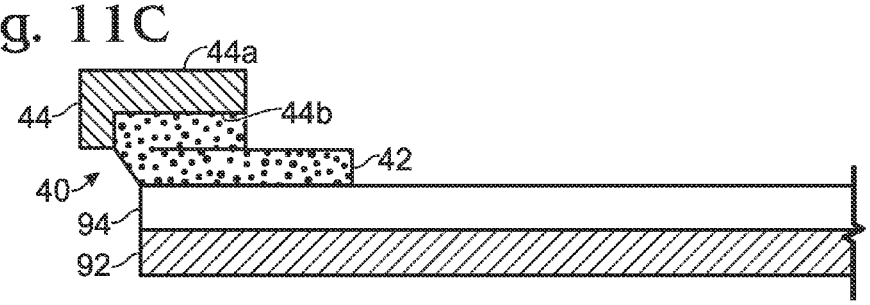
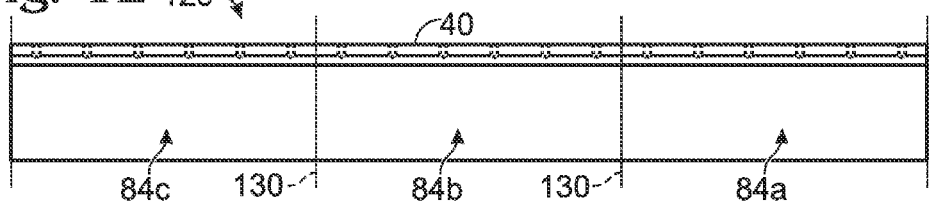
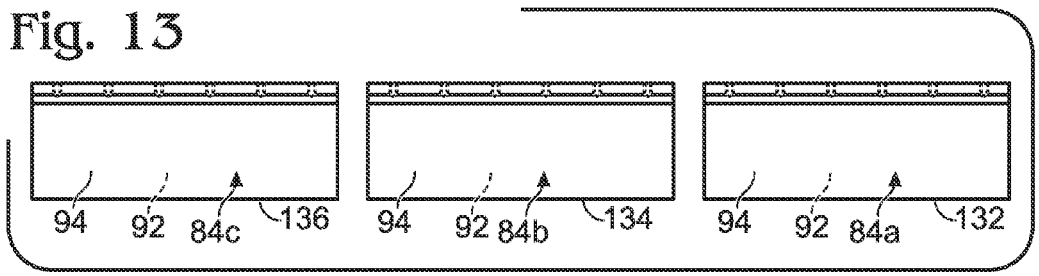
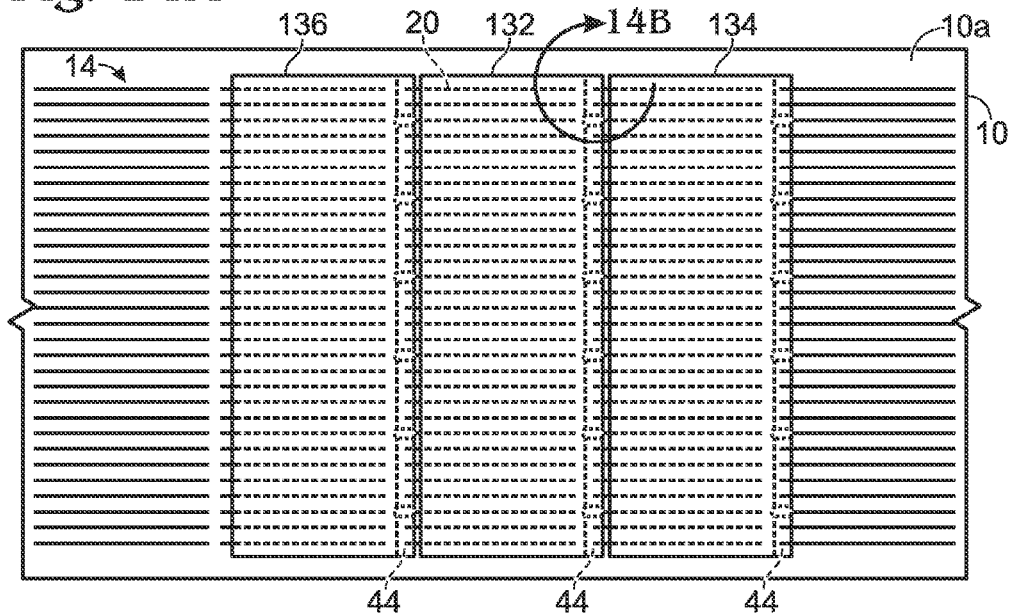

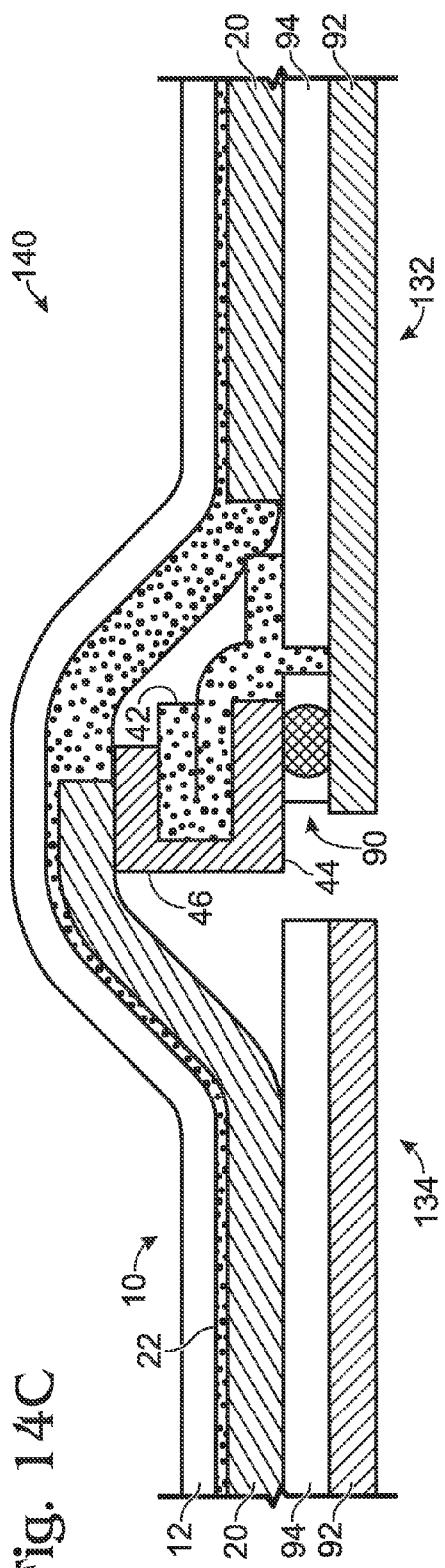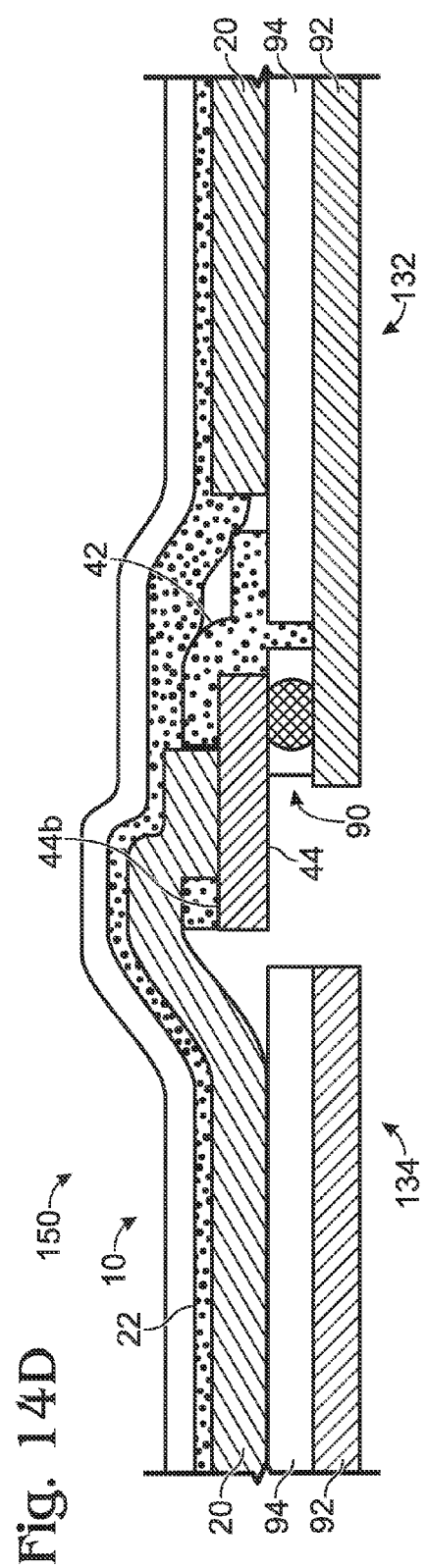

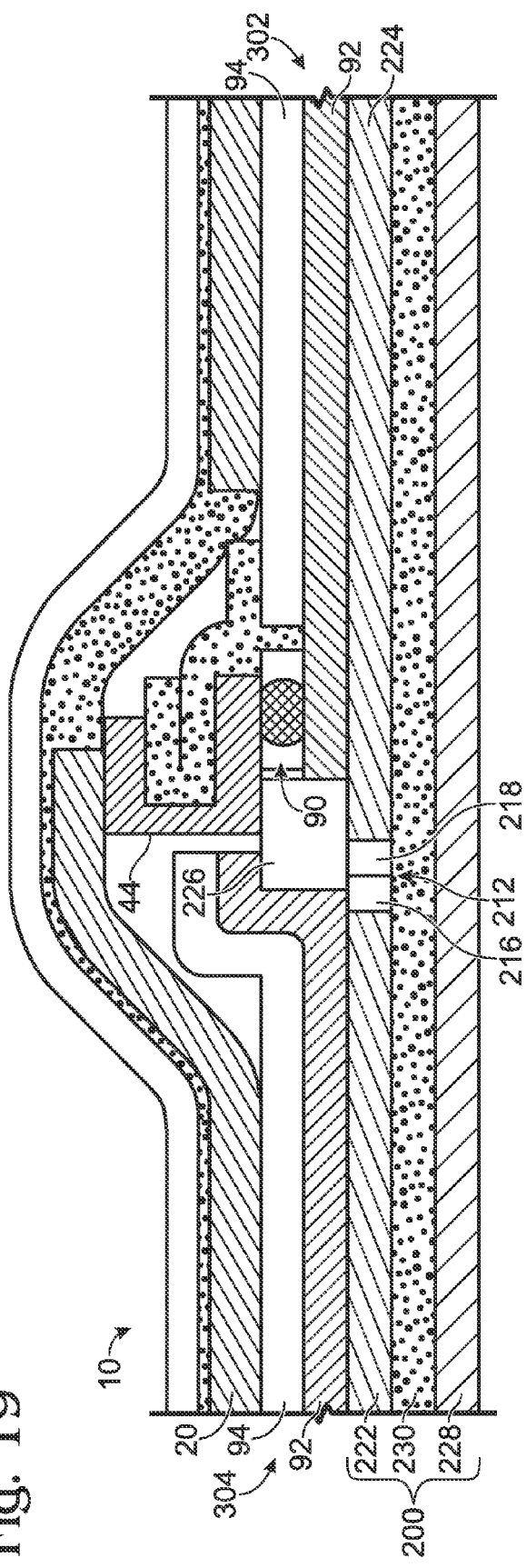

Fig. 20A 500

502 — apply a photoactive composition to a conductive substrate to produce a continuous sheet of flexible photovoltaic material including first and second cell regions

504 — scribe through the photoactive composition with one or more scribes to electrically isolate one or more interconnection regions disposed on the top side of the conductive substrate from the photoactive composition surrounding the one or more interconnection regions

506 — cut the photovoltaic material into first and second discrete photovoltaic cells corresponding respectfully to the first and second cell regions, each cell region including photoactive composition disposed on a top side of a conductive back sheet, wherein each conductive back sheet is a portion of the conductive substrate, and the first cell region includes a first interconnection region of the one or more interconnection regions;

508 — prepare interconnection tape including a conductive strip disposed on a dielectric strip

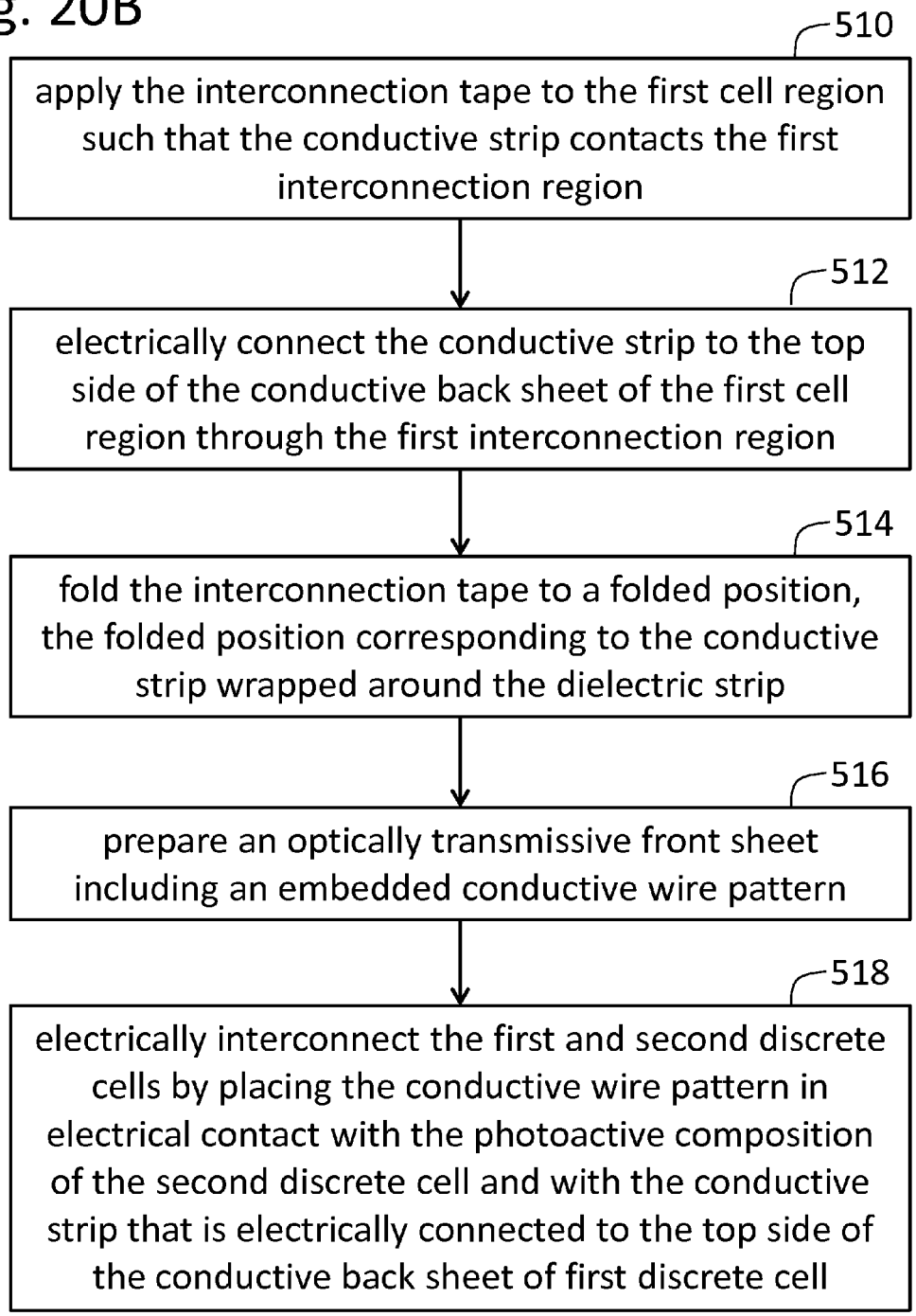

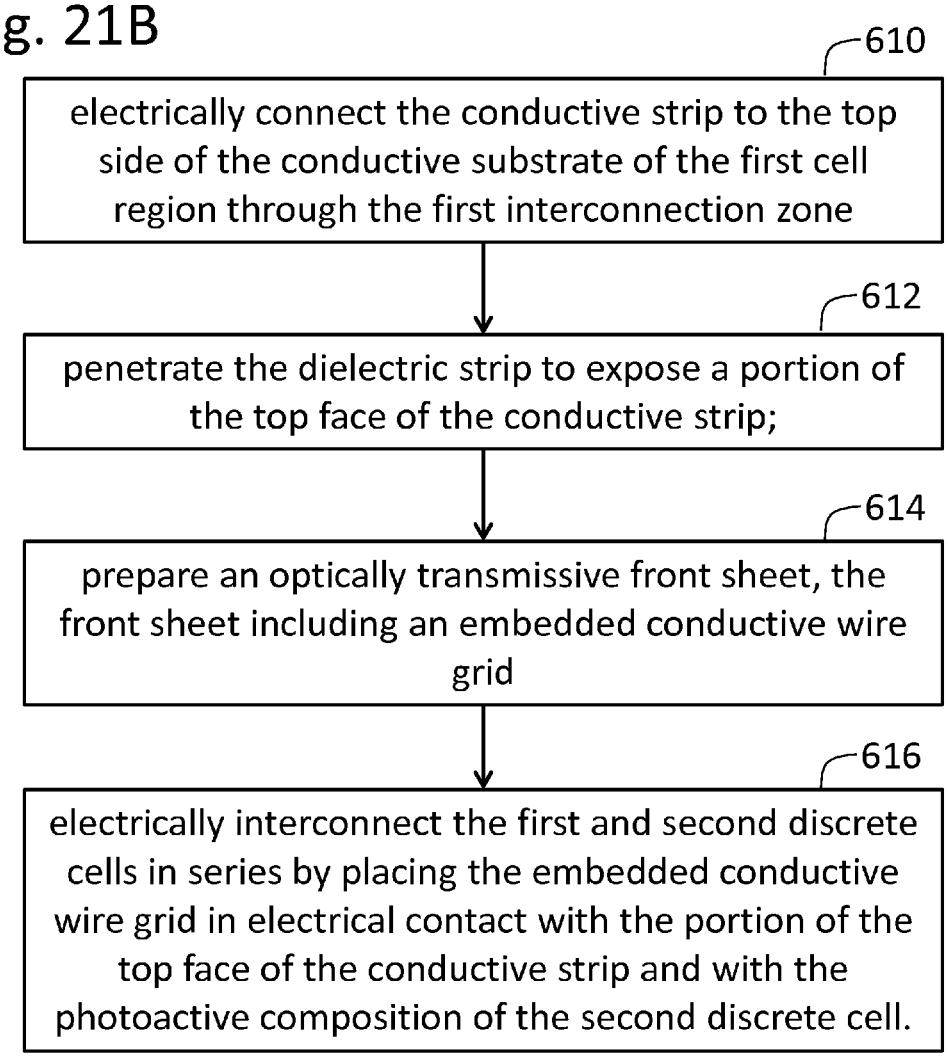

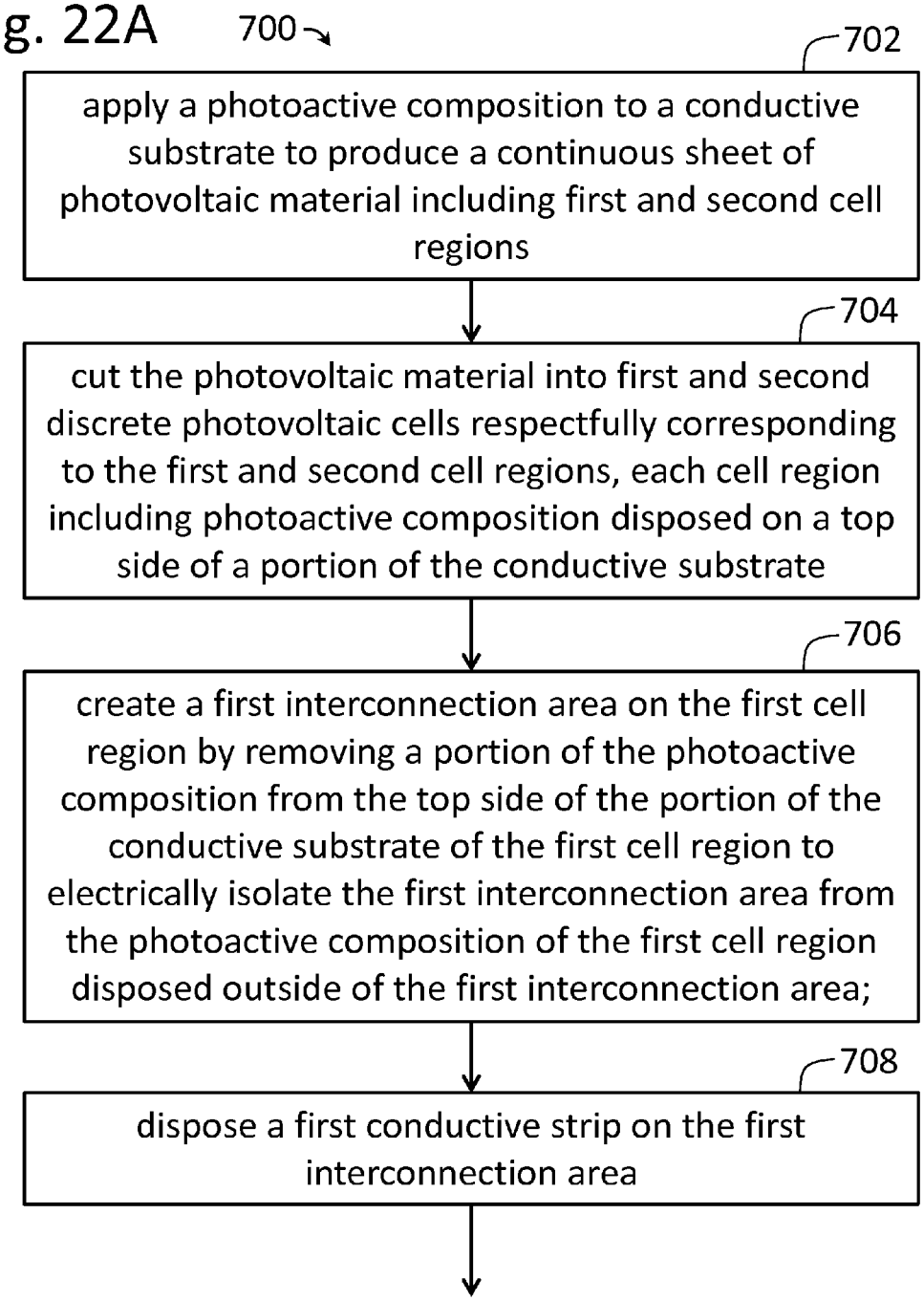

PHOTOVOLTAIC INTERCONNECT SYSTEMS, DEVICES, AND METHODS

CROSS-REFERENCE TO RELATED APPLICATION

This application claims priority from U.S. Provisional Patent Application Ser. No. 61/757,636, filed Jan. 28, 2013, which is hereby incorporated herein by reference. This application also incorporates by reference in their entireties the following U.S. patents, U.S. publications, U.S. and foreign applications: U.S. Pat. Nos. 5,681,402, 5,759,291, 4,574,160, 4,617,420, 4,888,061, 4,652,693, 5,391,235, 6,803,513, 5,457,057, 5,181,968, 7,276,724, 5,547,516, 5,735,966, 6,239,352, 6,310,281, 6,372,538, 6,414,235, 6,459,032, 6,690,041, 7,194,197, 7,507,903, 7,635,810, 7,732,243, 7,851,700, 7,868,249, 7,898,053, 7,898,054, 7,989,692, 7,989,693, 8,062,922, 20100147356, 20120000510, 20120000502, 20120006378, 20030121228A1, 20030127128A1, 20040069340, 20050176270, 20060032752, 20060174930, 20060180195, 20080011350, 20080227236, 20080257399, 20080314433, 20090107538, 20090111206, 20090145551, 20090169722, 20090163374, 20090223552, 20090293941, 20100108118, 20100193367, 20100218824, 20100224230, 20100229942, 20100269902, 20110056537, 20110067754, 20110070678, 20120000502, 20130269748, 12/482,699, WO2005077062 and WO2009006230.

INTRODUCTION

The field of photovoltaics generally relates to multi-layer materials that convert sunlight directly into DC electrical power. The basic mechanism for this conversion is the photovoltaic effect, first observed by Antoine-César Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from the junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies approaching 20%, which rivals or exceeds the efficiencies of the most efficient crystalline cells. In particular, the semiconductor material copper indium gallium diselenide (CIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates. Additional details relating to the composition and manufacture of thin film PV cells of a type suitable for use with the presently disclosed methods and apparatus may be found, for example, in U.S. Pat. Nos. 6,310,281, 6,372,538, and 7,194,197, all to Wendt et al., and U.S. Pat. No. 8,062,922 to Britt et al, all of which have been incorporated by reference.

As noted previously, a significant number of PV cells often are connected in series to achieve a usable voltage, and thus a desired power output. Such a configuration is often called a "string" of PV cells. Due to the different properties of crystalline substrates and flexible thin film substrates, the electrical series connection between cells may be constructed differently for a thin film cell than for a crystalline cell, and forming reliable series connections between thin film cells poses several challenges. For example, soldering (the traditional technique used to connect crystalline solar cells) directly on thin film cells exposes the PV coatings of the cells to damaging temperatures, and the organic-based silver inks typically used to form a collection grid on thin film cells may not allow strong adherence by ordinary solder materials in any case. Thus, PV cells often are joined with stand-alone wires or conductive tabs attached to the cells with an electrically conductive adhesive (ECA), rather than by soldering.

However, even when stand-alone wires or tabs are used to form inter-cell connections, the extremely thin coatings and potential flaking along cut PV cell edges introduces opportunities for shorting (power loss) wherever a wire or tab crosses over a cell edge. Furthermore, the conductive substrate on which the PV coatings are deposited, which typically is a metal foil, may be easily deformed by thermo-mechanical stress from attached wires and tabs. This stress can be transferred to weakly-adhering interfaces, which can result in delamination of the cells.

In addition, adhesion between the ECA and the cell back side, or between the ECA and the conductive grid on the front side, can be weak, and mechanical stress may cause separation of the collection grid at these locations. Also, corrosion can occur between the molybdenum or other coating on the back side of a cell and the ECA that joins a tab of the collection grid to the solar cell there. This corrosion may result in a high-resistance contact or adhesion failure, leading to power losses.

Advanced methods of joining thin film PV cells with conductive tabs or ribbons may largely overcome the problems of electrical shorting and delamination, but may require undesirably high production costs to do so. Furthermore, all such methods—no matter how robust—require that at least some portion of the PV string be covered by a conductive tab, which blocks solar radiation from striking that portion of the string and thus reduces the efficiency of the system. As a result, there is a need for improved methods of interconnecting PV cells into strings, and for improved strings of interconnected cells. Specifically, there is a need for strings and methods of their formation that reduce interconnection costs and reduce the fraction of each PV cell that is covered by the interconnection mechanism, while maintaining or improving the ability of the cell to withstand stress.

ICI (Integrated Cell Interconnect) technology overcomes the above problem, but presently relies upon a Cu grid collection structure formed in a subtractive process. Cu is electrodeposited on a polymer web, and more than 90% of the Cu is subsequently removed. The relative area removed in the grid area is even greater. While a portion of the Cu that is removed can be reclaimed, the process is relatively costly and inefficient, and only a few suppliers worldwide are capable of supplying the flexible interconnect structure produced in the way described.

In addition, the plating and subtractive etching process associated with the formation of current grid structures utilizes strong chemical baths that can adulterate the substrate (affecting solar module performance or reliability), or place constraints on suitable substrate materials.

SUMMARY

The wire ICI approach according to the present teachings replaces the Cu grid material with Cu wire embedded in a front sheet. Benefits of this new approach include Cu wire being inexpensive, and widely available from numerous manufacturers, in a large array of sizes. Furthermore, the equipment used to handle Cu wire is commonplace and inexpensive.

Photovoltaic module configurations, according to aspects of the present teachings, include multiple flexible thin film photovoltaic cells electrically connected in series, and laminated to a substantially transparent top or front sheet having an embedded conductive wire grid pattern facing the cells. A portion of the photoactive composition of each cell may be removed to expose the underlying conductive substrate, allowing cells to be interconnected by electrically connecting the embedded conductive wire grid pattern contacting the top surface of one cell with a conductive strip electrically connected to the top side of the conductive substrate of an adjacent cell.

Methods of manufacturing photovoltaic modules including integrated multi-cell interconnections are also described. Methods include steps of electrically isolating certain portions of cells to facilitate interconnection of the cells, by obliterating, removing or otherwise modifying photoactive material in cells to expose the underlying conductive substrate in certain regions, or to render the photoactive material sufficiently electrically conductive to form electrical connections with the conductive substrate.

For example, methods according to the present teachings may include embedding a conductive wire grid pattern in an adhesive layer of an optically transmissive front sheet, scribing through photoactive composition of a first cell to electrically isolate a plurality of interconnection regions disposed on a top side of the conductive substrate underlying the photoactive composition, preparing interconnection tape including a conductive strip disposed on a dielectric strip, applying the interconnection tape to the first cell such that the conductive strip contacts the interconnection regions of the first cell, electrically connecting the conductive strip to the top side of the conductive substrate of the first cell, folding the conductive strip so that it wraps around the dielectric strip, aligning the first cell and a second cell with the embedded conductive grid pattern of the front sheet, and electrically interconnecting the first and second cells in series by placing the embedded conductive wire pattern in electrical contact with the photoactive composition of the second cell and with the conductive strip that is electrically connected to the top side of the conductive substrate of the first cell.

In some cases, electrically connecting the conductive strip to the top side of the conductive substrate of the first cell may involve laser welding the conductive strip to the top side of the conductive substrate through photoactive composition disposed inside the interconnection region. Laser welding may convert existing semiconductor material, such as the photoactive composition, into material having low ohmic resistance (for example, resistance of 0.1 milliohms-$cm^2$ or less), thus allowing an electrical connection between the conductive strip and the conductive substrate of the cell to which it is welded.

Numerous other devices, intermediate articles and methods of manufacture will be apparent from the detailed description below and related figures.

BRIEF DESCRIPTION OF THE FIGURES

FIG. 6C is a cross-sectional view of the photovoltaic material taken along the line 6C-6C in FIG. 6B.

FIG. 7 is a schematic side view of an apparatus for roll-to-roll application of the interconnection tape of FIG. 3 to the interconnection regions of the cell regions of FIG. 6A.

FIG. 8 is a top plan view of the interconnection tape of FIG. 3 applied to the interconnection regions of the cell regions of FIG. 6A.

FIG. 9 is a magnified top plan view of three conductive fingers of the interconnection tape applied to three of the interconnection regions shown in FIG. 8.

FIG. 10 is a cross-sectional view taken along line 10-10 in FIG. 9 of one of the conductive fingers of the interconnection tape electrically connected to one of the interconnection regions.

FIG. 11A is a magnified top plan view similar to FIG. 9 but showing the interconnection tape folded to a folded position to place a conductive buss bar of the interconnection tape over both the conductive fingers and the photoactive composition between adjacent interconnection regions.

FIG. 11B is a cross-sectional view taken along the line 11B-11B in FIG. 11A showing the interconnection tape in the folded position.

FIG. 11C is a cross-sectional view taken along the line 11C-11C in FIG. 11A showing a dielectric layer of the interconnection tape sandwiched between the buss bar and the photoactive composition between adjacent interconnection regions.

FIG. 12 is a top plan view similar to FIG. 8 of the portion of photovoltaic material including the cell regions of FIG. 6A but with the interconnection tape in the folded position.

FIG. 13 is a top plan view of three discrete photovoltaic cells cut from the portion of photovoltaic material of FIG. 12.

FIG. 14A is a top plan view of a photovoltaic module including the front sheet of FIG. 1, and the photovoltaic cells of FIG. 13 flipped over, aligned with, and applied to the bottom side of the front sheet to electrically interconnect the cells in series.

FIG. 14C is a cross-sectional view of the photovoltaic module taken along line 14C-14C in FIG. 14B showing the electrical interconnection of adjacent photovoltaic cells.

FIG. 14D is a cross-sectional view similar to FIG. 14C, but showing electrical interconnection of adjacent photovoltaic cells with unfolded interconnection tape.

FIG. 17 is a schematic cross-sectional view of the backsheet taken along line 17-17 in FIG. 16 through a bypass string of the backsheet.

FIG. 19 is a schematic cross-sectional view of the backsheet applied to electrically interconnected adjacent photovoltaic cells taken along line 19-19 in FIG. 18.

FIGS. 20A-20B when viewed together are a flow-chart depicting a method of manufacturing a photovoltaic module, according to aspects of the present teachings.

FIGS. 21A-21B when viewed together are a flow-chart depicting another method of manufacturing a photovoltaic module, according to aspects of the present teachings.

FIGS. 22A-22B when viewed together are a flow-chart depicting yet another method of manufacturing a photovoltaic module, according to aspects of the present teachings.

DETAILED DESCRIPTION

Systems, devices and methods for interconnecting flexible, thin-film photovoltaic (PV) cells are provided. According to the present teachings, systems and methods of interconnecting thin-film photovoltaic cells may include a series of photovoltaic cells and a transparent top or front sheet covering the cells. Electrically-conductive pathways are established connecting a top or "sunny" side of one cell to the top of the conductive substrate underlying the photoactive material of an adjacent cell. Portions of the photoactive material of the interconnected cells may be scribed away or otherwise removed, to expose the underlying conductive substrate and to facilitate interconnection. The top sheet may include copper wires embedded in a transparent adhesive and configured to form electrical connections between adjacent cells that are placed in contact with the grid.

Figure 1:
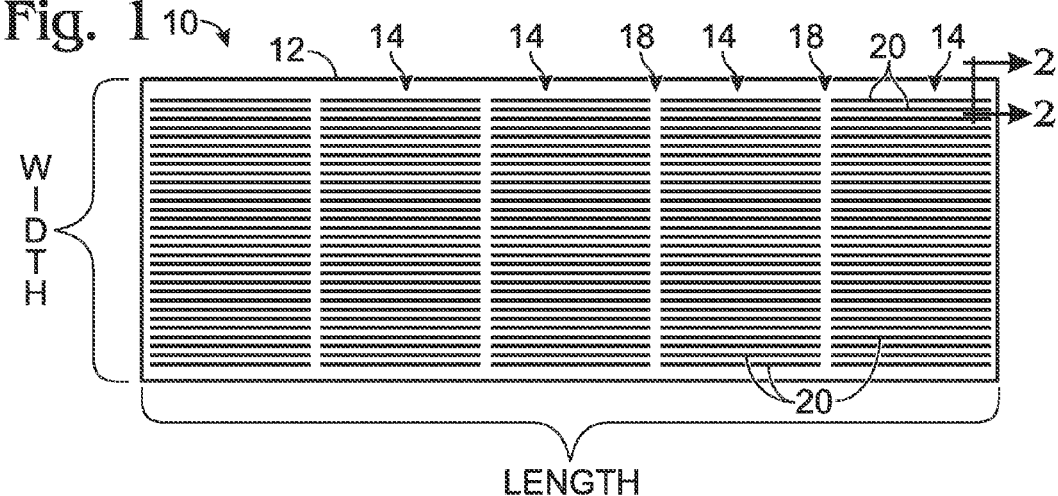
FIG. 1 is a top plan view of a bottom side of an optically transparent front sheet with an embedded conductive wire grid according to aspects of the present teachings.
Figure 2:
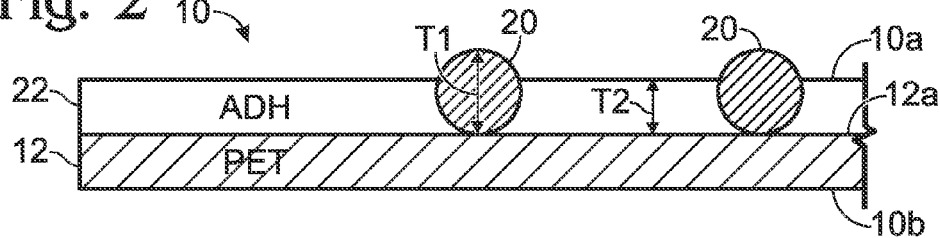
FIG. 2 is a cross-sectional view of the front sheet taken along the line 2-2 in FIG. 1.

FIGS. 1 and 2 depict a substantially optically transparent or transmissive top sheet (or front sheet), generally indicated at 10, according to aspects of the present teachings. Top sheet 10 includes a substrate 12 and a plurality of conductive grids (or patterns), generally indicated at 14. Substrate 12 may be constructed from a clear insulating polymer film such as polyethylene terephthalate (PET), polyethylene naphthalate (PEN), polyetheretherketone (PEEK), polymide, or ethylene tetrafluoroethylene (ETFE), among others, or from another suitable optically transmissive and/or non-conductive material.

Each adjacent pair of conductive grids 14 are separated by a grid gap, generally indicated at 18. The distance between each grid gap 18 may correspond to a width of a photovoltaic cell to be applied to front sheet 10, as described below. Grid gaps 18 may be constructed by removing a section of wire from a continuous length of wire. For example, grid gaps 18 may be produced by shearing a continuous length of wire before attachment to top sheet 10 or by laser-cutting a continuous length of wire either before or after attachment to top sheet 10. The size of grid gaps 18 may vary (or be customized) to correspond to particular string lengths or number of photovoltaic cells in a string. Optically transparent top sheet 10 may be prepared roll-to-roll to facilitate assembly of a photovoltaic module, as described below.

As shown in FIG. 2, front sheet 10 may have a bottom side (or surface) 10a and a top side (or surface) 10b. As shown in FIGS. 1 and 2, wire 20 of conductive grids 14 may be embedded in front sheet 10 (e.g., wire 20 may extend though bottom side 10a), such that only a portion of wire 20 protrudes through bottom side 10a and away from top side 10b. For example, the conductive wire grid or pattern (e.g., wires 20) may have a thickness T1 in a direction normal to bottom side 10a of front sheet 10 (e.g., in a direction parallel to the direction normal to bottom side 10a), and at least 10% of the thickness of T1 may extend through bottom side 10a and be embedded in front sheet 10.

The precise fraction of the thickness T1 of wires 20 that extends through the bottom side of the front sheet can be varied. For example, in various different embodiments, anywhere from 5% to 95% of the thickness T1 of wires 20 may extend through bottom side 10a and be embedded in front sheet 10. Furthermore, in some cases, different wires may be provided with different thicknesses, or may be embedded to different depths in the front sheet, so that some wires protrude further out of the front sheet than others.

By embedding wires 20 in front sheet 10, a conductive collection grid suitable for an ICI configuration that provides an entirely front-side serial cell interconnection may be constructed relatively efficiently and/or inexpensively. For example, the embedded wire pattern, while having a thickness which is typically greater than previous electroplated collection grids, may protrude from the bottom surface of the front sheet about as much as previous electroplated collection grids.

As shown in FIGS. 1 and 2, each conductive grid 14 includes a plurality of conductive wires 20 embedded in an adhesive layer 22 that is included in front sheet 10. As shown, a bottom side of adhesive layer 22 forms bottom side 10a of front sheet 10. The separation distance between conductive wires can be any suitable amount, with an exemplary range of 3-7 millimeters between adjacent wires.

In some embodiments, one or more of the conductive grids may include one or more conductive wires. For example, one or more of the conductive grids may include a looping wire structure formed by a single wire, as shown in U.S. Provisional Application Ser. No. 61/757,636 which has been incorporated by reference.

As shown in FIG. 2, one or more conductive wires 20 are embedded in adhesive layer 22 to produce the embedded conductive wire grid. Adhesive layer 22 is disposed on a bottom side 12a of optically transmissive substrate 12 (shown here as a layer of PET). Adhesive layer 22 has a thickness T2 in a direction normal to bottom side 12a of substrate 12. T1 also extends in the direction normal to bottom side 12a. As shown, T1 and T2 have the same order of magnitude (i.e., T2 is greater than or equal to 10% of T1, and T1 is greater than or equal to 10% of T2).

As shown in FIG. 2, a minority of T1 of one or more of conductive wires 20 protrudes from adhesive layer 22 opposite optically transmissive substrate 12, and a majority of T1 is embedded in adhesive layer 22.

Wires 20 may be embedded in adhesive layer 22, for example, by pressure, by heat, or by a combination of pressure and heat. Adhesive layer 22 may be constructed from an optically transparent, optically transmissive, non-conductive, and/or ultraviolet-stable (UV-stable) adhesive.

In some embodiments, bottom side 10a may be a layer of adhesive or an adhesive film. For example, wires 20 may be embedded in substrate 12, and may completely pass through the layer of adhesive to protrude from bottom side 10a of front sheet 10.

Wires 20 may be made of copper (Cu) or any other suitable conductive material, and may be coated with a conductive substantially non-oxidizing material to prevent high resistance oxide formation (e.g., on the copper). For example, copper wires 20 may be coated with tin, silver, or any other coating suitable for preventing high resistance oxide formation. Wires 20 (including any conductive substantially non-oxidizing coatings) may be of a diameter (or thickness) of the same order of magnitude as the thickness of adhesive layer 22. In some embodiments, wires 20 may be constructed from 32 AWG wire. As shown in FIG. 2, wires 20 are of a diameter sufficient to remain partially exposed when embedded in adhesive layer 22.

Figure 3:
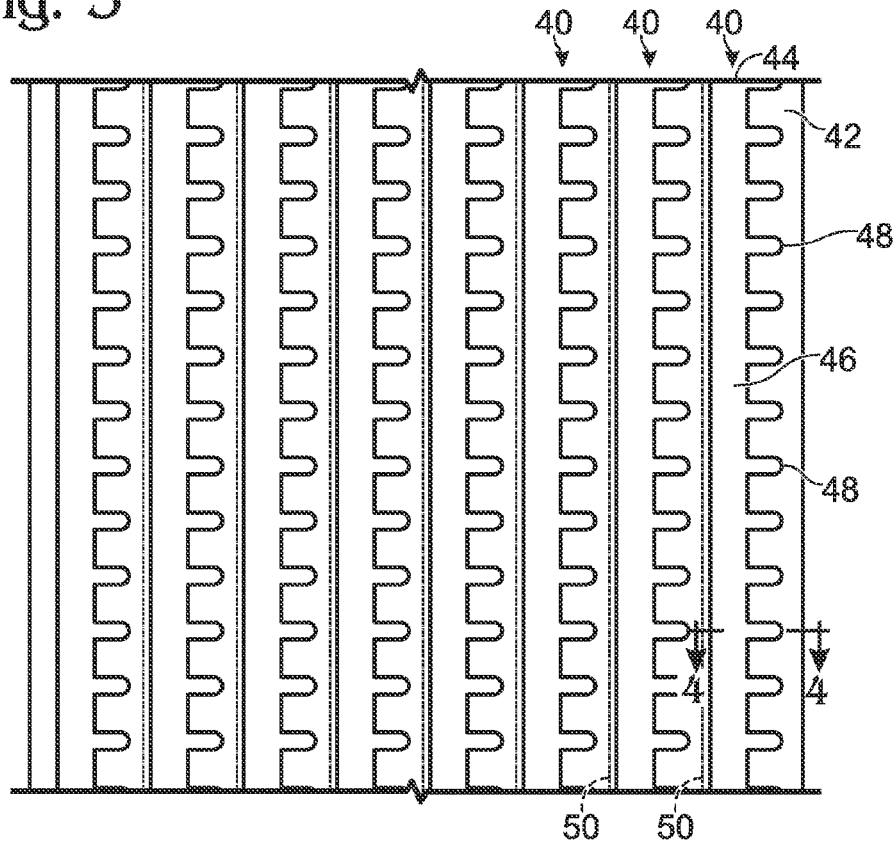
FIG. 3 is a top plan view of a plurality of interconnection tapes according to aspects of the present teachings.

FIG. 3 shows a plurality of interconnection tapes (or strips), a few of which are each generally indicated at 40. Each interconnection tape 40 includes a substrate (or dielectric strip) 42, and a conductive strip 44 disposed on the substrate. Each conductive strip 44 includes a conductive buss bar 46 and a plurality of conductive fingers (or interconnection tabs) 48. As shown, each of conductive fingers 48 extends from buss bar 46.

The plurality of interconnection tapes 40 may be prepared roll-to-roll and slit into strips along cut lines 50 to form individual lengths, rolls, or reels of interconnection tape 40.

Figure 4:
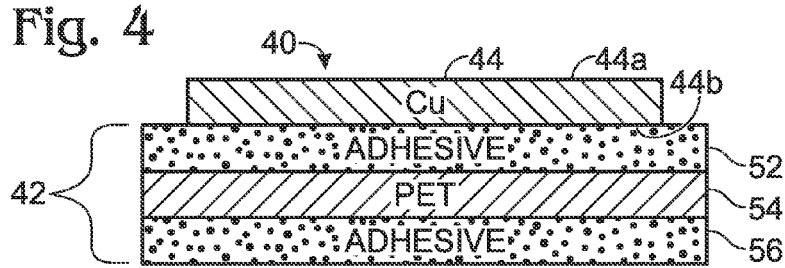
FIG. 4 is a cross-sectional view of an interconnection tape of FIG. 3 taken along the line 4-4 in FIG. 3.

FIG. 4 shows a cross-section of interconnection tape 40 along the line 4-4 in FIG. 3. As shown, conductive strip 44 is a conductive layer (shown here as a copper layer), and dielectric strip 42 includes a first adhesive layer 52, a substrate 54, and a second adhesive layer 56. Conductive strip 44 has a bottom face 44a and a top face 44b. Dielectric strip 42 is disposed on top face 44b of conductive strip 44. The terms "bottom" and "top" indicate the orientation of faces 44a and 44b when interconnection tape 40 is applied to interconnect adjacent PV cells. Thus, when in actual use, interconnection tape 40 will be oriented upside down relative to the orientation shown in FIG. 4.

The conductive layer of the interconnection tape may be formed by electro-deposition of copper or some other suitable conductive material. For example, one ounce of copper may be deposited to form a copper layer having a thickness of 1.4 millimeters. The electroplating of the copper layer may be resist-etched to form buss bar 46 and interconnection tabs 48 (see FIG. 3). Alternatively, the copper layer may be electrodeposited directly into foil form, and then attached to the substrate in a roll-to-roll process.

First and second adhesive layers 52, 56 may be constructed of a UV-stable, non-conductive, and/or clear adhesive. For example, adhesive layers 52, 56 may be a pressure-sensitive adhesive or may be a thermoplastic. Substrate 54 may be optically transmissive and/or optically transparent. For example, substrate 54 may be a clear polymer, such as PET, PEN, PEEK, polymide, or ETFE, among others.

FIG. 4 shows layer 54 as a layer of PET. Alternatively, interconnection tape 42 may include only a conductive layer or strip disposed on an adhesive (e.g., dielectric adhesive), such as an adhesive film.

Figure 5:
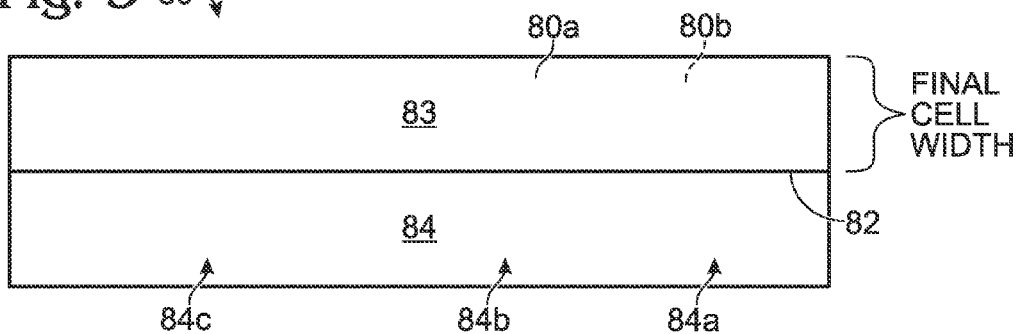
FIG. 5 is a top plan view of a length of photovoltaic material in web form.

FIG. 5 depicts a length of thin-film, photovoltaic material, generally indicated at 80, which may be from a roll or "web." Photovoltaic material 80 may be a continuous length of flexible photovoltaic material produced by applying a photoactive composition 80a to a conductive substrate 80b. For example, the photoactive composition may include adjacent layers of cadmium sulfide (CdS) and copper indium gallium diselenide (CIGS) to form a p-n junction. More details regarding the composition and manufacture of exemplary photovoltaic cells (or material) that may be used in conjunction with the present teachings are disclosed, for example, in U.S. Pat. No. 8,062,922, which has been incorporated by reference.

Photovoltaic material 80 may be cut or slit along slit line 82 to form a plurality of reels of photovoltaic material, such as first and second reels 83 and 84, each including one or more cell regions. For example, reel 84 may include first, second, and third photovoltaic cell regions, respectively generally indicated at 84a, 84b, and 84c. The distance between slit line 82 and a longitudinal edge of photovoltaic material 80, or the width of each reel, may be the final width of the photovoltaic cells. For example, once cell regions 84a-c have been cut into discrete photovoltaic cells (see FIG. 13), the width of each cell may correspond to the width of reel 84 shown in FIG. 5. As an alternative to forming reels out of unscribed photovoltaic material 80, the material may be scribed first in the manner described below, and then slit into reels after scribing.

Figure 6A:
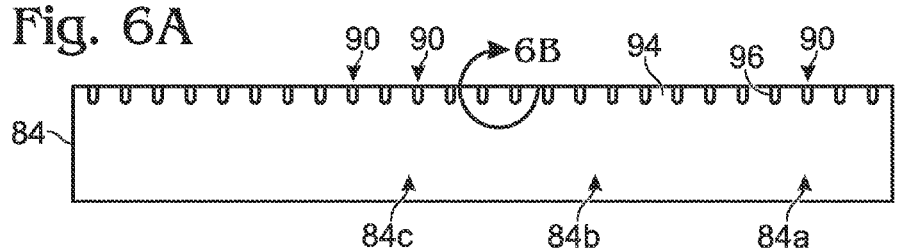
FIG. 6A is a top plan view of a portion of the photovoltaic material cut from the web of FIG. 5 and scribed to electrically isolate a plurality of interconnection regions from photoactive composition surrounding the plurality of interconnection regions on a plurality of cell regions.
Figure 6B:
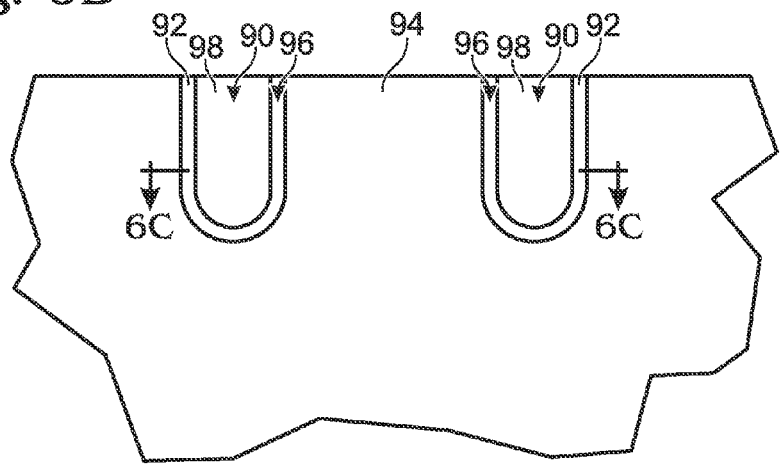
FIG. 6B is a magnified top plan view of a portion of the photovoltaic material shown in FIG. 6A.

FIGS. 6A-6C show reel 84 of the photovoltaic material including a plurality of interconnection regions (or areas, or zones), a few of which are generally indicated at 90. Reel 83 of FIG. 5 may be prepared in the same manner as reel 84. In FIGS. 6A-6C, photoactive composition has been scribed away from portions of the photovoltaic material to form the plurality of interconnection areas 90 on the cell regions by exposing conductive substrate 92 (see FIGS. 6B and 6C), which is disposed beneath the photoactive composition. Interconnection areas 90 may be slightly larger than conductive fingers 48 (see FIG. 3).

In some embodiments, the perimeter of reel 84 of photovoltaic material may also be scribed away to facilitate electrical isolation. Each of interconnection regions 90 may be formed or created by scribing away, obliterating, or otherwise removing photoactive composition from a top side 92a of a conductive substrate 92 of the photovoltaic material (see FIG. 6C) to electrically isolate each of interconnection regions 90 from photoactive composition 94 disposed on top side 92a outside of interconnection regions 90. For example, one or more scribes (indicated at 96 in FIG. 6A, and generally indicated at 96 in FIGS. 6B and 6C) may electrically isolate one or more interconnection regions 90 disposed on top side 92a of conductive substrate 92 from photoactive composition 94 surrounding interconnection regions 90. For example, reel 84 may be laser patterned through all layers of the photoactive composition down to top side 92a (e.g., a Mo layer) of substrate 92. Laser patterning may provide a clean, shunt-fee, particle-free scribe.

Each of conductive substrates (or conductive back sheets) 92 of cell regions 84a-c may be portions of conductive substrate 80b of photovoltaic material 80 (see FIG. 5).

As shown in FIG. 6A, photoactive composition 94, which is electrically isolated from adjacent interconnection regions 90, is disposed between adjacent interconnection regions 90 on first cell region 84a, on second cell region 84b, and on third cell region 84c.

In some embodiments, one or more interconnection regions 90 may include photoactive composition 98 (see FIGS. 6B and 6C) electrically isolated from photoactive composition 94 surrounding the one or more interconnection regions. In other words, photoactive composition 98 may remain after the scribing operation that creates electrically isolated regions 90. Each of compositions 94, 98, and the photoactive composition removed may be portions of the photoactive composition applied to the conductive substrate of photovoltaic material 80 (see FIG. 5) prior to material 80 being slit into reels.

In other embodiments, one or more of interconnection regions may not include any remaining photoactive composition. For example, creating the interconnection regions 90, such as in a scribing operation, may involve removing all of the photoactive composition in the interconnection regions.

Removing photoactive composition from top side 92a (see FIG. 6C) may also be described as removing photoactive composition from a top side of a conductive substrate or conductive back sheet of one or more photovoltaic cells, as the cell regions of the reel may be cut into a plurality of discrete photovoltaic cells, such as first, second, and third cells as indicated in FIGS. 12 and 13.

In some embodiments, an entire cell perimeter or sides only may be patterned or scribed down to top side 92a of substrate 92. U.S. Patent Applications 20120000502 and 20130269748, both of which have been incorporated by reference, describe further details of such perimeter and side patterning.

FIG. 7 schematically depicts an apparatus, generally indicated at 100, for roll-to-roll application of an interconnection tape or strip (e.g., interconnection strip 40 of FIG. 3) to interconnection regions (e.g., interconnection regions 90 of FIGS. 6A-6C) of cell regions, according to aspects of the present teachings. Application of interconnection strip 40 to interconnection regions 90 may also describe application of an interconnection strip 40 to discrete cells, as photovoltaic material may be subsequently cut into discrete cells, or in some cases the photovoltaic material may be cut into discrete cells before application of interconnection strips.

Apparatus may include a roll 102 of interconnection tape 40, and a roll 104 of photovoltaic material including a plurality of interconnection regions. The interconnection tape of roll 102 may be prepared as described in relation to FIGS. 3 and 4. Photovoltaic material 84 of roll 104 may be prepared as described in relation to FIGS. 5 and 6A-6C. Interconnection tape (or interconnect tape) 40 and photovoltaic material 84 may meet at placement rollers 106 where conductive fingers 48 (see FIG. 3) of interconnect tape 40 may be aligned with interconnection areas 90 (see FIGS. 6A-6C) on photovoltaic material 84. An alignment mechanism such as a vision system (not shown) may be used to align the conductive fingers and the interconnection areas.

At placement rollers 106 interconnection tape 40 may be applied to the interconnection areas such that conductive fingers 48 (see FIG. 3) of conductive strip 44 (see FIG. 3) are brought into contact with interconnection areas 90 (see FIGS. 6A-6C, and 8-10). Interconnection tape 40 may be temporarily bonded in place, for example by heat staking. Heat staking may be accomplished by, for example, using direct heat from laser diodes, a laser, or hot air jets, which may be directed at a small number of spots, for example, 1- to 2-cm in diameter, to melt an adjacent layer of interconnect tape 40 and bond it to photovoltaic material 84.

In some cases, alternatively or in addition to heat staking, a thin layer of adhesive may be applied to photovoltaic material 84 to adhere interconnection tape 40 to photovoltaic material 84. For example, first adhesive layer 52 of interconnection tape 40 (see FIGS. 3 and 4) may adhere interconnection tape 40 to photovoltaic material 84. This adhesive will typically be curable in a subsequent lamination step, but may adhere sufficiently prior to lamination to hold the assembly together.

As shown in FIG. 7, apparatus 100 includes an interconnection device 108. Interconnection device 108 may electrically connect each conductive finger 48 (see FIG. 3) to top side 92a (see FIGS. 6B and 6C) of the conductive substrate of photovoltaic material 84 through interconnection regions 90 (see FIGS. 6A-6C). For example, interconnection device 108 may be a laser welder configured to electrically connect the conductive strip to the interconnection regions.

Laser welding may generally cause photovoltaic material 98 (see FIGS. 6A-6C) inside interconnection regions 90 to be converted into material having low ohmic resistance, as is described in U.S. Patent Application 2013/0269748, which has been incorporated by reference. Laser welding may generally cause material of conductive fingers 48 (see FIG. 3) of interconnection tape 40, material of substrate 92 (see FIGS. 6B and 6C), and/or converted photovoltaic material 98 to comingle to some extent to electrically connect conductive fingers 48 (see FIG. 3) to top side 92a (see FIGS. 6B and 6C) of the conductive substrate of photovoltaic material 84 through interconnection regions 90 (see FIGS. 6A-6C). As the materials comingle and cool, the conductive fingers of interconnection tape 40 and the top side of the conductive substrate of photovoltaic material 84 are in effect joined.

Interconnection device 108 may electrically connect interconnection tape 40 to photovoltaic material 84 after interconnection tape 40 has been applied to the cell regions of photovoltaic material 84. The photovoltaic cell assembly at this stage in the assembly process is further described in FIGS. 8-10.

As shown in FIG. 7, apparatus 100 includes a folding device, generally indicated at 110. Folding device 110 may be configured to fold interconnection tape 40 to a folded position (see FIG. 11A) to provide a conductive surface with which the embedded wire grid of the front sheet (see FIGS. 1 and 2) may be brought into electrical contact. For example, the buss bar of interconnection tape 40 may be folded over the laser welded portion of interconnection tape 40 and/or a region of photovoltaic material 84 disposed between adjacent interconnection regions, as further described in FIGS. 11A-11C. Alternatively, a step of folding interconnection tape 40 can be eliminated by exposing a portion of a top face of the conductive strip, as further described below in relation to FIGS. 10 and 14D.

As shown in FIG. 7, apparatus 100 includes a windup roll 112. After folding, the photovoltaic cell assembly of interconnection tape 40 applied to photovoltaic material 84 may be gathered by (or wound up on) windup roll 112 to complete the roll-to-roll assembly. Before being gathered by windup roll 112, in-line cell testing may be implemented.

FIGS. 8-10 show a photovoltaic assembly, generally indicated at 120, that may be produced by the apparatus of FIG. 7, for example, after electrical connection by device 108, but before folding by device 110. As shown, assembly 120 includes interconnection tape 40 applied to cell regions 84a-c of photovoltaic material 84. Application of interconnection tape 40 to photovoltaic material 84 may result in conductive strip 44 being sandwiched between the "sunny" side of photovoltaic material 84 (e.g., photoactive composition 80a—see FIG. 5) and dielectric strip 42 of interconnection tape 40.

FIG. 9 is a detailed view of a portion of photovoltaic assembly 120, showing conductive fingers 48 aligned with, applied to, and electrically connected to interconnection regions 90 defined by scribes 96. Application of interconnection tape 40 to photovoltaic material 84 may cause adhesive of dielectric strip 42 to adhere to photovoltaic material 94 between first and second interconnection regions, such as adjacent interconnection regions 90. As shown, conductive fingers 48 are smaller than interconnection regions 90. Electrical connections 122 (e.g., produced by device 108 of FIG. 7 on assembly 120) may electrically connect conductive strip 44 to the top side of substrate portions of cell regions 84a-c underlying the photoactive composition of those regions. As will be later described, interconnection tape 40 may be folded along line 124 to provide an electrical contact point for the embedded wire grid.

FIG. 10 is a cross-section taken along the line 10-10 in FIG. 9, showing electrical connection 122 of conductive strip 44 to top side 92a of substrate 92 of photovoltaic material 84, which supports photoactive composition 94 and 98. FIG. 10 shows dielectric layer 42 as being an adhesive layer, however, dielectric layer 42 extending across top face 44b of conductive strip 44 may include a substrate sandwiched between two adhesive layers, as shown in FIG. 4.

As shown in FIG. 10, bottom face 44a of conductive strip 44 is disposed adjacent to photovoltaic material 84 (e.g., conductive strip 44 is shown disposed on interconnection region 90). Dielectric strip 42, which is disposed on top side 44b of conductive strip 44, extends across interconnection region 90 and may substantially fill scribe 96, further electrically isolating interconnection region 90 from photoactive composition (or material) 94 disposed outside of and surrounding interconnection region 90. As shown, an adhesive of dielectric strip completely fills scribe 96 when interconnection tape 40 is applied to photovoltaic material 84.

Conductive finger 48 is in contact with interconnection area 90, which is electrically isolated from photoactive composition 94 by scribe 96. Buss bar 46 of conductive strip 44, from which conductive finger 48 extends, is electrically connected to top side 92a of substrate (or conductive back sheet) 92 of photovoltaic material (or photoactive cell) 84 by way of electrical connection 122. Electrical connection 122 may be a laser welded region of low resistance photovoltaic material or comingled material as described in FIG. 7, or may be any material created or provided to electrically connect conductive strip 44 to substrate 92. As indicated, electrical connection 122 includes a portion of photoactive material 98 inside interconnection region 90 that has been converted into material having low ohmic resistance material, as previously described.

FIG. 10 shows dielectric layer unaffected by electrical connection 122, however in some cases, such as with laser welding, formation of electrical connection 122, may involve obliterating or altering a portion of dielectric layer 42, and penetrating conductive finger 48.

Referring back to FIG. 9, fold line 124 is depicted along which interconnection tape 40 may be folded to the folded position, as described above in relation to FIG. 7, and is further described below in relation to FIGS. 11A-11C. Folding interconnection tape 40 may provide a conductive surface for the embedded wire grid of the front sheet (see FIGS. 1 and 2) to contact for the interconnection of photovoltaic cells.

Alternatively, interconnection tape 40 may remain unfolded, as depicted in FIGS. 9 and 10, and electrical contact may be made between the embedded wire grid of the front sheet and conductive strip 44 by penetrating dielectric strip 42. For example, vias or penetrations may be formed in dielectric strip 42 by removing the polymer and/or adhesive layers of dielectric strip 42 (see FIG. 4) to expose a portion of top face 44*b* of conductive strip 44 (see FIG. 14D). The embedded wire grid of the front sheet may then contact conductive strip 44 by way of the vias or penetrations.

These vias or penetrations may be formed by any suitable apparatus or method. For example, the vias may be laser patterned, laser cut, die cut, or masked and etched before or after the interconnection tape is applied to the photovoltaic material. The vias may be a single via extending across the length of the interconnection tape, or may be a plurality of vias spaced apart to register with the plurality of wires of the embedded wire grid.

FIGS. 11A-11C depict portions of the photovoltaic cell assembly shown in FIGS. 8-10, but with interconnection tape 40 in the folded position, as described in FIG. 7. For example, folding interconnection tape 40 along line 124 of FIG. 9 may place buss bar 46 over conductive fingers 48, over photoactive composition 98 inside the interconnection regions (see FIG. 11B), and/or over photoactive composition 94 between adjacent interconnection regions (see FIGS. 11A and 11C).

As shown in FIG. 11A, application of interconnection tape 40 to a cell region involves application of a first conductive finger to a first interconnection region (e.g., interconnection region 90 on the far right-hand side), and application of a second conductive finger to a second interconnection region (e.g., interconnection region 90 in the center of the view) included in the cell region, and interconnection tape 40 folded to the folded position places buss bar 46 above photoactive composition 94 between the first and second interconnection regions.

As shown in FIG. 11B, when interconnection tape 40 is folded to the folded position, bottom face 44*a* of the conductive strip remains in contact with interconnection area 90 and electrical connection 122. This lower portion of the conductive strip 44, as is shown in FIG. 11B, may remain substantially parallel to substrate 92 and may correspond to conductive finger 48. A portion of the conductive strip corresponding to buss bar 46 may extend perpendicular to and away from substrate 92, and may fold over dielectric strip 42 to place buss bar 46 in a position over conductive fingers 48 and over photoactive composition 94 disposed between adjacent interconnection regions 90.

As shown in FIG. 11B, the folded position corresponds to conductive strip 44 wrapped around dielectric strip 42, and dielectric strip 42 enveloped or sandwiched between buss bar 46 and conductive finger 48.

If dielectric strip 42 includes a substrate sandwiched between two adhesive layers, as is shown in FIG. 4, then the folded position may correspond to first adhesive layer 52 folded over onto itself, and positioned between two portions of substrate 54, in which case second adhesive layer 56 (see FIG. 4) may be the adhesive that substantially fills scribe 96 in FIG. 11B.

Adhesive included in dielectric strip 42 may hold the interconnection tape in the folded position. For example, as shown in FIG. 11B, the adhesive of dielectric strip 42 may adhere to itself (and/or buss bar 46) to hold buss bar 46 in a position directly over conductive finger 48.

As shown in FIG. 11C, at a point (or along an entire length) between adjacent interconnection regions 90 of FIG. 11A, interconnection tape 40 in the folded position may sandwich dielectric strip 42 between conductive strip 44 (e.g., the buss bar) and photoactive material 94. As shown, the folded position may correspond to bottom face 44*a* of conductive strip 44 disposed opposite from photoactive composition 94 relative to top face 44*b* of conductive strip 44. For example, FIG. 11C shows the folded position corresponding to top face 44*b* of the conductive strip positioned between photoactive material 94 and bottom face 44*a* of the conductive strip between adjacent interconnection regions.

FIG. 12 depicts photovoltaic assembly 120 including cell regions 84*a-c* with interconnection tape 40 in the folded position electrically connected to interconnection regions as previously described. FIG. 12 shows cut lines 130, where photovoltaic assembly 120 may be cut, as shown in FIG. 13, to form a plurality of discrete (or individual) photovoltaic cells including a first cell 132 (e.g., corresponding to first cell region 84*a*), a second cell 134 (e.g., corresponding to second cell region 84*b*), and a third cell 136 (corresponding to third cell region 84*c*). Each of cells 132, 134, and 136 may include a portion of photoactive composition 94 disposed on a top side of a portion of conductive substrate (conductive back sheet) 92.

Figure 14B:
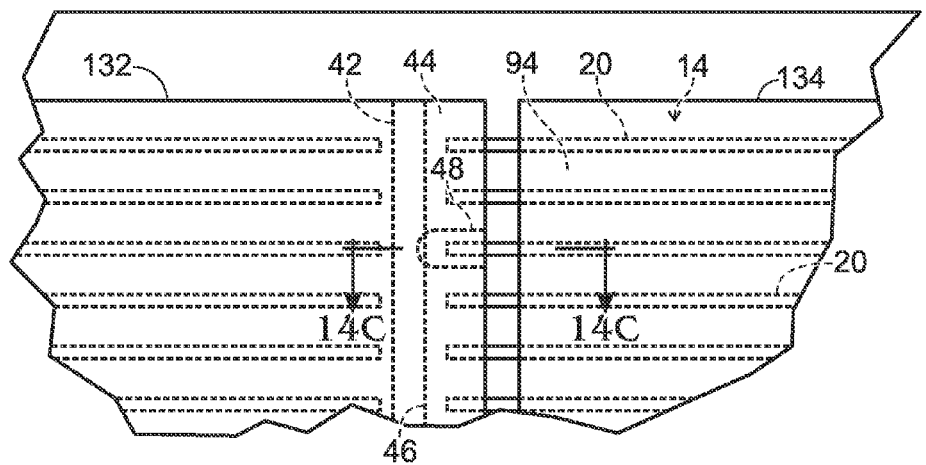
FIG. 14B is a magnified top plan view of the photovoltaic module of FIG. 14A.
Figure 15:
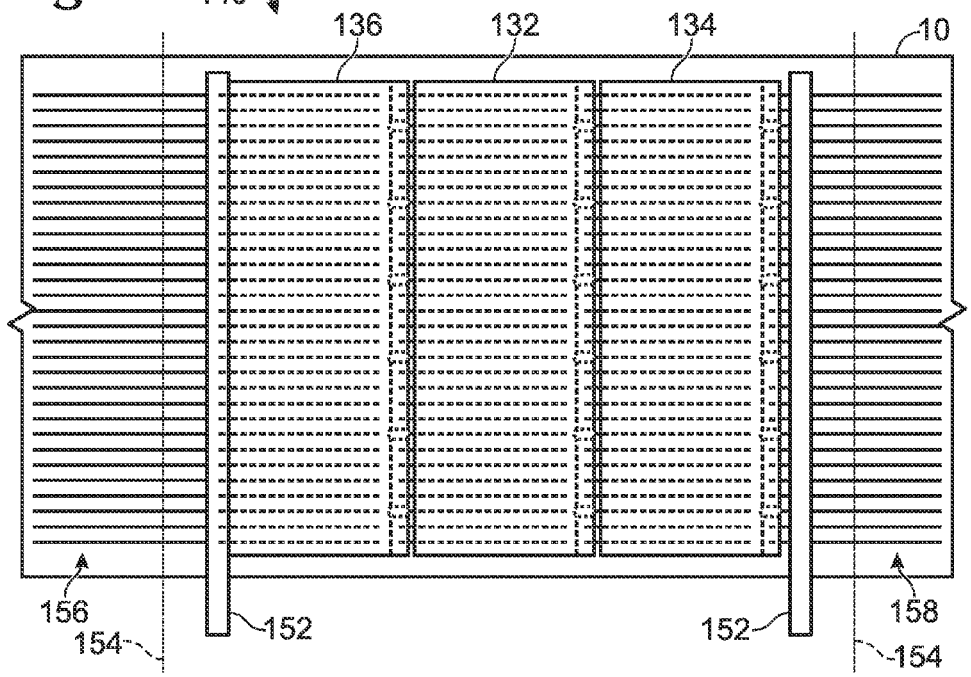
FIG. 15 is a top plan view of the photovoltaic module of FIG. 14A with applied termination ribbons.

FIGS. 14A, 14B, and 15 depict a photovoltaic module, generally indicated at 140. As shown, photovoltaic module 140 includes front sheet 10, and first, second, and third cells 132, 134, and 136. In FIGS. 14A, 14B, and 15, front sheet 10 is shown with bottom side 10*a* (see FIG. 2) normal to the view, and cells 132, 134, and 136 flipped over so that their sunny sides face bottom side 10*a* of front sheet 10 through which embedded wires 20 protrude.

FIG. 14A shows cells 132, 134, and 136 aligned with grids 14 so that wires 20 electrically interconnect the cells in series. For example, the plurality of discrete photovoltaic cells 132, 134, 136 may be applied to bottom side 10*a* of front sheet 10, such that wires 20 contact the conductive strip (e.g., buss bar 46) of one photovoltaic cell (e.g., cell 132), and also contact the photoactive material of an adjacent cell (e.g., cell 134). In this way, front sheet 10 with embedded conductive wire grids 14 may interconnect the conductive strip of one cell with the photoactive material of an adjacent cell. In other words, placing a photovoltaic cell on the front sheet may form an electrical connection between the substrate of the corresponding cell and an embedded connection grid, which in turn makes electrical contact with the top or "sunny" side of the adjacent cell.

As described, individual photovoltaic cells 132, 134, and 136 are positioned on the electrically conductive grid of front sheet 10 with the photovoltaic material facing the grid wires of top sheet 10. A pick and place robot with vision may be used to place the cells. Photovoltaic cells 132, 134, and 136 may be cut to a length that corresponds to the width of conductive grid 14.

As is apparent from the preceding figures, cells 132, 134, and 136 may be electrically interconnected in series after conductive strips 44 are disposed on respective interconnection regions of first cell 132, second cell 134, third cell 136, or any other suitable number of cells. For example, a first conductive wire grid 14 may be placed in electrical contact with photoactive composition 94 of second cell 134 and with conductive strip 44 (see FIGS. 13 and 14B) which has already been disposed on an interconnection region associated with first cell 132. Similarly, third cell 136 may be electrically interconnected in series with cells 132 and 134 by a second conductive wire grid 14 placed in electrical contact with photoactive composition 94 of first cell 132 and with conductive strip 44 (see FIGS. 13 and 14B) which has already been disposed on an interconnection region associated with third cell 132. FIG. 14C is a cross-sectional view of photovoltaic module 140 taken along the line 14C-14C in FIG. 14B to show the electrical interconnection of cells 132 and 134. FIG. 14C has been flipped so that the "sunny" sides of the cells face upward in the view. Front sheet 10, including substrate 12 and embedded wires 20 in adhesive layer 22, overlays adjacent discrete photovoltaic first and second cells 132 and 134.

As shown, wire 20 (on the left-hand side of FIG. 14C) makes electrical contact with buss bar 46 of conductive strip 44 of photovoltaic cell 132 and with photoactive material 94 of photovoltaic cell 134. In some embodiments, photoactive material 94 may include a top layer of TCO with which wires 20 may make direct contact. The TCO may be a negative terminal of cell 134. Because conductive strip 44 is electrically connected to substrate 92 of cell 132 (e.g., a positive terminal of cell 132), as described in FIGS. 8-10, electrical connection is made between photoactive material 94 of cell 134 and substrate 92 of cell 132 to electrically interconnect these adjacent cells in series. Cell 136 (or any other number of suitable cells) may be electrically interconnected to cell 132 in the same manner as cell 132 is to cell 134.

Front sheet 10 and the cells placed thereon may be laminated together. Adhesive of adhesive layer 22 and/or dielectric strip 42 may maintain pressure contact between front sheet 10 and the cells established in lamination to hold embedded wires 20 in electrical contact with the photoactive composition of one cell and with the conductive strip electrically connected to the top side of the conductive substrate of the second cell through an interconnection region.

FIG. 14D is a cross-section similar to FIG. 14C, but showing another embodiment, of a photovoltaic module, generally indicated at 150, in which conductive strip 44 is in an unfolded position, as described in FIGS. 8-10. Similar to FIG. 14C, wire 20 may make contact with conductive strip 44 of first cell 132 and with photoactive material 94 of second cell 134. Wire 20 may contact conductive strip 44 without conductive strip 44 being placed in the folded position by penetrating dielectric strip 42, as described in FIGS. 9-10. A via or penetration in dielectric strip 42 may allow wire 20 to contact conductive strip 44 of photovoltaic cell 132, thereby electrically connecting substrate 92 of cell 132 to photoactive composition 94 of adjacent cell 134. As shown here in FIG. 14D, the via is formed through a middle portion of dielectric strip 42 to expose a portion of top face 44b of conductive strip 44 between two opposing portions of dielectric strip 42. A via configuration such as this may result in a portion of dielectric strip 42 sandwiched between wire 20 and conductive strip 44 when wire 20 contacts the exposed portion of conductive strip 44. In other embodiments, the via may be formed from the far left edge of conductive strip 44 toward a middle portion of conductive strip 44, such that a portion of dielectric strip 42 is not disposed between wire 20 and conductive strip 44 when they are brought into electrical contact.

In some embodiments, electrically interconnecting cells 132 and 134 may involve bringing conductive strip 44 (e.g., in the unfolded position, as shown in FIG. 14D) into direct electrical contact with photoactive composition 94 of cell 134 (e.g., by placing the buss bar directly on top of the TCO), in which case wires 20 contacting composition 94 of cell 134 may abut or be disposed proximal conductive strip 44 to facilitate collection of electrons.

FIG. 15 shows photovoltaic module 140 of FIG. 14A with termination ribbons 152 applied to opposite ends of a string of cells 132, 134, and 136. Termination ribbons 152 may be heat staked in place. The structure shown in FIG. 15 may be vacuum laminated, with or without a backsheet. A pick and place robot with vision, or fixed reels with cutter/grippers, or any other suitable apparatus, may place ribbons 152. Ribbons 152 may be made of Cu, and may be coated (e.g., with Sn, Ag, or another material) to prevent high resistance oxide formation.

Ribbons 152 may cover each grid wire that exits out from under an adjacent cell to ensure low-resistance contact between the corresponding ribbon and grid wire after lamination.

Ribbons 152 can be brought out to one or more sides of module 140 (e.g., the ribbons may extend from one longitudinal side, as shown), or brought through slits cut in front sheet 10 or through slits cut in an applied backsheet, such as backsheet 200 of FIGS. 16-19. Backsheet 200 is described in more detail below. If no backsheet is included, then a release liner may be used.

Module 140 may be cut along lines 154, or can be stored on reels and cut later. Sections generally indicated at 156 and 158 can be pre-configured to omit grid wires or to have custom grid wire lengths.

The next portion of the present disclosure describes the use of integrated bypass diodes, according to the present teachings, in conjunction with the previously described photovoltaic assemblies and method of manufacture thereof.

In general, individual photovoltaic cells are serially connected in photovoltaic modules to produce useful voltages. Since the current must be the same at all points in a series circuit, each cell is forced to produce or conduct the same current as the entire string. A potential problem arises whenever one or several cells are 'shaded', reducing their produced current. For example, a cell might be literally shaded while others in the string remain exposed to sunlight, or a cell might stop performing at full capacity for some other reason. A string of any reasonable number of cells has a high enough voltage to exceed the reverse breakdown voltage of a single, shaded cell. In this case, the other cells force the string current through the shaded cells in a 'reverse' sense to the diode formed by the PV cell.

This usually causes irreversible damage to the shaded cell (a permanent shunt at the site of the reverse breakdown), and subsequently a permanent loss in power output even when the shade is removed. Moreover, a 'hot spot' can appear at the site of reverse breakdown in the shaded cell, causing damage to the PV package, or even a safety hazard due to the danger of fire.

The potential for cell damage due to current forced through the cell is a feature of all photovoltaic systems, including crystalline silicon and thin film types. Typically, photovoltaic modules incorporate bypass diodes to protect each cell, groups of cells, or the module from reverse currents and thus breakdown events with the attendant damage. Commercially produced silicon semiconductor or Schottky diodes, usually in a standard electronics package with tab or axial leads, are typically added to a photovoltaic module. In the most extensive cases, one or more diodes are added across each photovoltaic cell (in a reverse polarity).

Drawbacks of the standard approach are significantly increased cost, added manufacturing complexity, multiple fragile connections, and added failure points. Another disadvantage is that these discrete bypass diode devices create hot spots in and of themselves, by virtue of the significant heat dissipation in a small volume during the bypass operation. Excessive temperatures may cause the bypass diode to fail, or damage the photovoltaic module package.

For thin film flexible photovoltaic products, which are intended to be lightweight, several more serious drawbacks accrue because the discrete bypass diodes are of substantial thickness (often 2-5 mm). As a result, encapsulating these parts inside the protective package of the photovoltaic module necessarily increases the package thickness substantially (and thus the cost and weight, with reduced flexibility). The complexity and speed of lamination processes are adversely affected by the inclusion of the discrete diodes in the laminated package, making periodic "lumps" that must be processed without causing damage.

U.S. Pat. No. 6,690,041 entitled "Monolithically Integrated Diodes in Thin Film Photovoltaic Devices," which has been incorporated by reference, describes a method of using a small area of the thin film photovoltaic material, adjacent to each cell, and interconnected using scribing and monolithic fabrication schemes, to form an integral bypass diode. This method avoids the expense of adding a discrete bypass diode, and retains the thin, continuous nature of the product, permitting a very lightweight, low cost, thin lamination package for the entire module.

However, the approach of U.S. Pat. No. 6,690,041 is disadvantageous in that it consumes frontside area, i.e., area that would otherwise be used to generate power. The area required for the bypass diode is governed by heat dissipation, and can be substantial. The former approach also requires that the bypass diode be of the same material as the photoactive material, and poses a somewhat cumbersome arrangement wherein the bypass diode for one cell is located on an adjacent cell.

Incorporation of bypass diodes in a photovoltaic module, according to the present teaching, may retain all the advantages of the diodes disclosed in U.S. Pat. No. 6,690,041, but may avoid the drawbacks mentioned above.

Figure 16:
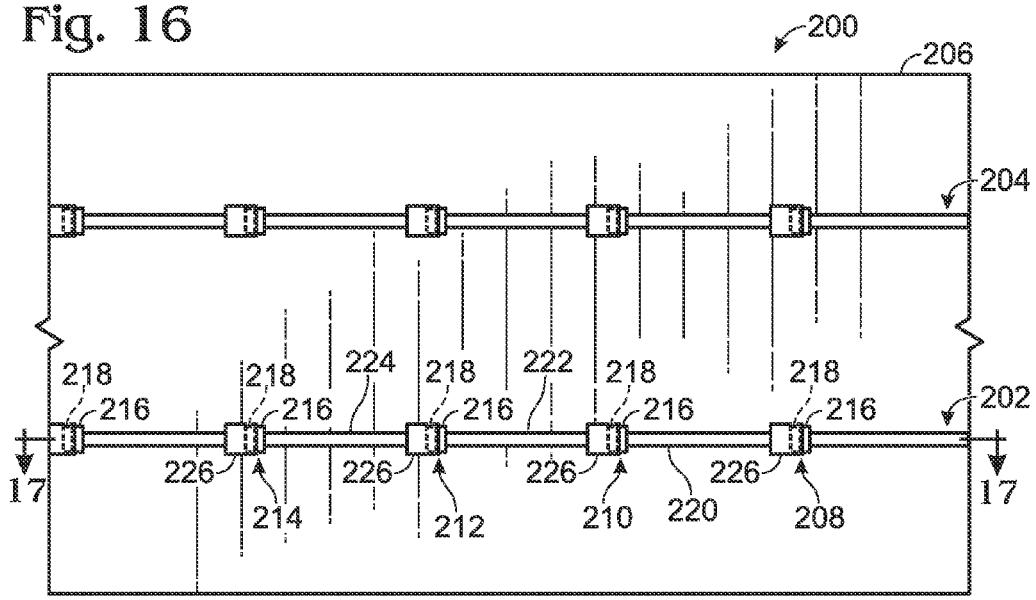
FIG. 16 is a schematic top plan view showing a backsheet prepared with bypass strings including diodes.

FIGS. 16 and 17 depict a backsheet, generally indicated at 200, that may optionally be prepared and applied to a back side (i.e., "non-sunny" side, or conductive substrate side) of a photovoltaic module, according to aspects of the present disclosure. Backsheet 200 includes first and second bypass strings, generally indicated at 202 and 204, disposed on a substrate 206.

As shown, string 204 is similar in construction to string 202. For example, components of string 204 may be similar to the components of string 202, and string 204 may be configured to substrate 206 in the same way that string 202 is to substrate 206. Thus, the below description of string 202 may also apply to string 204.

Bypass string 202 includes a plurality of bypass diodes (e.g. first, second, third, and fourth bypass diodes, generally indicated at 208, 210, 212, and 214 respectively). Each of diodes 208, 210, 212, and 214 includes an anode portion 216 and a cathode portion 218.

Bypass string 202 includes conductive ribbon sections (or strips) 220, 222, and 224. Ribbon sections 220, 222, and 224 may be discrete ribbons, made of any suitable conductive material, such as copper.

The conductive ribbon sections may electrically connect the cathode portion of one cell with the anode portion of an adjacent cell. For example, as can be seen best in FIG. 17, cathode portion 218 of diode 208 is electrically connected to anode portion 216 of diode 210 by conductive ribbon 220, cathode portion 218 of diode 210 is electrically connected to anode portion 216 of diode 212 by conductive ribbon 222, and cathode portion 218 of diode 212 is electrically connected to anode portion 216 of diode 214 by conductive ribbon 224.

Bypass string 202 includes a plurality of insulator strips 226. Insulator strips 226 may be sections of insulation tape, or any other suitable electrically insulating material. Each of insulator strips 226 may cover (or extend over) a portion of a diode and a portion of a ribbon section. For example, as shown in FIGS. 16 and 17, one insulator strip 226 covers all of cathode portion 218 of diode 208, covers a portion of anode portion 216 of diode 208, and covers a portion of ribbon section 220 near diode 208. As shown, the other insulator strips are similarly configured to other respective diodes and ribbon sections.

Substrate 206 may be made of one or more non-conductive materials, such as a non-conductive adhesive disposed on a non-conductive structural layer. For example, FIG. 17 shows substrate 206 including a structural layer 228 supporting an adhesive layer 230, which may adhere string 202 to structural layer 228 and/or backsheet 200 to the back side of the photovoltaic module (e.g., to the conductive substrates of the cells). Adhesive layer 230 may be a dielectric adhesive layer, and structural layer 228 may be constructed from any suitable structural material, such as a clear polymer such as PET, PEN, PEEK, polymide, or ETFE, among others, or from another suitable structural and/or non-conductive material.

Each bypass diode of backsheet 200 may be disposed near adjacent photovoltaic cells so that the anode portion of a first bypass diode is electrically connected to the back side of one of the adjacent cells and the cathode portion of the first bypass diode is electrically connected to the back side of the other adjacent cell. Because the front side of one cell may be connected in electrical series with the back side of the adjacent cell (e.g., as described in relation to FIGS. 14A-14D), the diode may be effectively electrically connected to the front and back side of the same cell. The result is that the diode may function as a bypass diode without reducing the exposed "sunny side" area of the photovoltaic assembly and without creating unwieldy lumps that might be difficult to laminate.

The bypass diodes of backsheet 200 may be thin film bypass diodes and may include a dielectric pattern disposed on the side of the diode to be connected to a photovoltaic cell string to facilitate proper electrical connection. As shown in FIG. 16, multiple bypass strings may be employed depending on the cell current requirements. For example, FIG. 16 shows backsheet 200 including two bypass strings that may be subsequently applied to the back side of photovoltaic cells (see FIG. 18). Alternatively, in some embodiments one bypass string may be sufficient. In other embodiments, backsheet 200 may include more than two bypass strings.

Backsheet 200 may be prepared as a sheet or as a roll that may be formed in a roll-to-roll process. Backsheet 200 may be cut to a size corresponding with the width of a photovoltaic cell to be applied to a photovoltaic module as described below.

Figure 18:
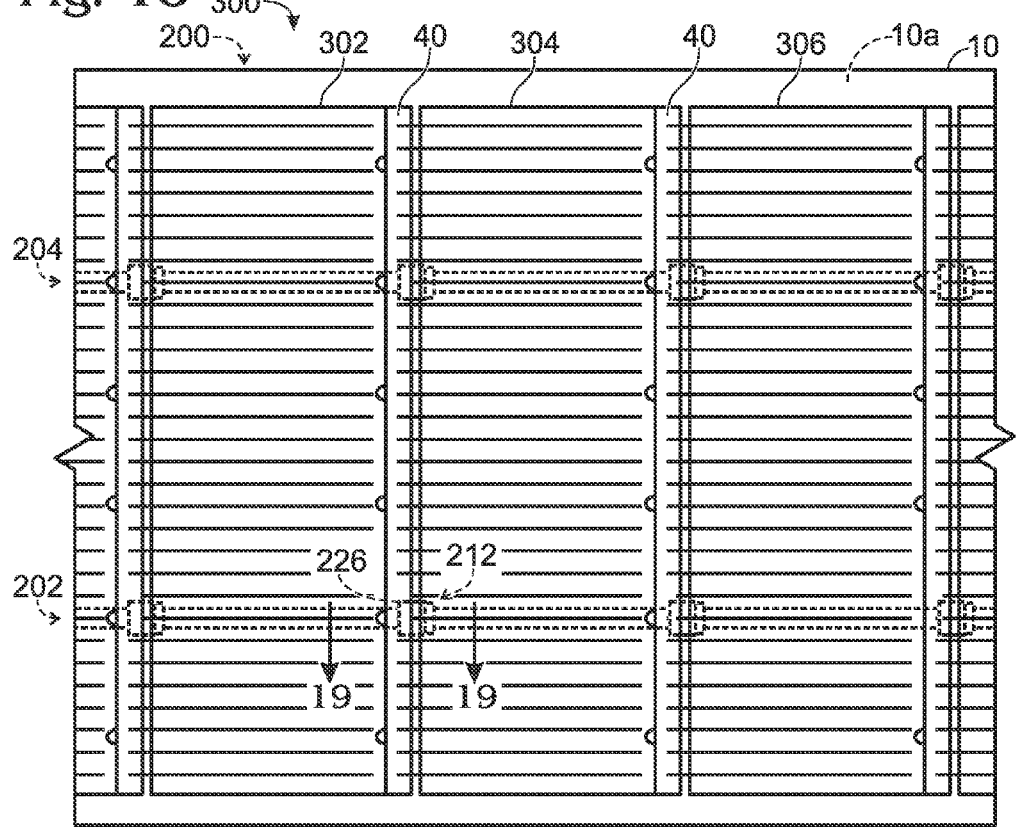
FIG. 18 is a schematic top plan view of the backsheet of FIG. 16 applied to a photovoltaic module similar to the photovoltaic module of FIG. 15.

FIG. 18 shows backsheet 200 applied to a back side of a photovoltaic module, generally indicated at 300. In FIG. 18, bottom surface 10a of front sheet 10 is facing away from the normal direction of the view of FIG. 18.

As shown, module 300 is similar to the modules of FIGS. 14A and 15. For example, module 300 includes first, second, and third discrete photovoltaic cells 302, 304, and 306, each including interconnection tapes 40 in the folded position and disposed on interconnection regions.

Cells 302, 304, and 306 may be electrically interconnected in series by embedded wire grids protruding from bottom surface 10a of front sheet 10, as previously described. Though the cells and embedded wire grids are below the top surface of front sheet 10 in FIG. 18, the cells and wire grids are shown in solid lines to simplify the drawing, and also because front sheet 10 is shown here as being optically transmissive.

In FIG. 18, backsheet 200 is aligned such that each diode of bypass strings 202 and 204 is disposed near adjacent photovoltaic cells, such as diode 212 disposed near adjacent cells 302 and 304. Insulator strips 226 are disposed adjacent to each diode, as further described and shown in FIG. 19, to prevent both the anode portion and the cathode portion, or both terminals of the associated bypass diode, from contacting the same cell back, which would cause electrical shorting. Insulator strips 226 may have an adhesive coating on the side adjacent to the photovoltaic cell to eliminate void space between photovoltaic cells and insulator strips.

Alternatively, one or more of the bypass diodes may include insulating housings, in which case one or more of insulator strips 226 may not be needed. For example, one or more of the bypass diodes may extend from a first adjacent cell to a second adjacent cell. The anode portion of the diode may be electrically connected to (or may contact) the back side of the conductive substrate of the first adjacent cell. The cathode portion of the diode may be electrically connected to (or may contact) the back side of the conductive substrate of the second adjacent cell. The insulating housing of the diode may electrically insulate the cathode portion of the diode from being electrically connected to the back side of the conductive substrate of the first adjacent cell, and may electrically insulate the anode portion of the diode from being electrically connected to the back side of the conductive substrate of the second adjacent cell.

As shown in FIG. 18, backsheet 200 with integrated bypass diodes (i.e., the bypass diodes of strings 202 and 204) may be attached to bottom sides of conductive substrates of first cell 302, second cell 304, and third cell 306. For example, backsheet 200 and photovoltaic module 300 may be laminated or otherwise attached, which, combined with the adhesive of backsheet 200, may ensure reliable contact between bypass strings 202 and 204 and the cells of photovoltaic module 300.

FIG. 19 is a cross-sectional view taken along line 19-19 of FIG. 18 depicting backsheet 200 applied to electrically interconnected adjacent photovoltaic cells 302 and 304, similar to those shown in FIG. 14C. Substrate 92 of cell 302 is in direct contact with conductive ribbon strip 224, and substrate 92 of cell 304 is in direct contact with conductive ribbon strip 222. As shown, anode portion 216 of diode 212 is electrically connected to substrate 92 of photovoltaic cell 304 through direct electrical contact and through ribbon section 222, and cathode portion 218 of diode 212 is electrically connected to substrate 92 of photovoltaic cell 302 through ribbon section 224.

The conductive ribbon strips may be configured on backsheet 200 to make pressure contact directly to the back or non-sunny side of the solar string of the photovoltaic module, as ribbon strips 222 and 224 do in FIG. 19.

In FIG. 19, anode portion 216 electrically contacts substrate 92 of cell 304, but in some embodiments, anode portion 216 may not electrically contact substrate 92. For example, diode 210 may be disposed in a gap between cells 302 and 304 such that anode portion is only electrically connected to substrate 92 of cell 304 via conductive ribbon 222, as cathode portion is with substrate 92 of cell 302 in FIG. 19.

As shown, substrate 92 of photovoltaic cell 302 is electrically connected to photoactive material 94 of photovoltaic cell 304 via wire 20 and conductive strip 44 through interconnection region 90, as described above in relation to similar embodiments. Thus diode 210 may be effectively electrically connected to both substrate 92 and photoactive material 94 of photovoltaic cell 304.

As seen best in FIG. 19, insulator strip 226 may be disposed adjacent to and covering cathode portion 218 to ensure that cathode portion 218 and anode portion 216 do not short by both coming into electrical contact with the same conductive substrate 92. Insulator strip 226 may also cover a small portion of anode portion 216 to ensure electrical isolation.

FIGS. 20A and 20B when viewed together depict a method, generally indicated at 500, of manufacturing a photovoltaic module, according to aspects of the present teachings.

Method 500 may include a step 502 of applying a photoactive composition to a conductive substrate to produce a continuous sheet of flexible photovoltaic material including first and second cell regions. The continuous sheet of flexible photovoltaic material may be a roll or a reel of photovoltaic material, which may be generally referred to as a photovoltaic "web".

Method 500 may include a step 504 of scribing through the photoactive composition with one or more scribes to electrically isolate one or more interconnection regions disposed on the top side of the conductive substrate from the photoactive composition surrounding the one or more interconnection regions. For example, the photovoltaic web may be scribed (e.g., laser patterned) in a roll-to-roll process so that the removal of photoactive composition to create electrically isolated interconnection regions may occur on the cell regions of a roll, a reel, or on multiple cell regions of a roll to later be split into reels of scribed cell regions.

Method 500 may include a step 506 of cutting the photovoltaic material into first and second discrete photovoltaic cells corresponding respectively to the first and second cell regions, each cell region including photoactive composition disposed on a top side of a conductive back sheet, wherein each conductive back sheet is a portion of the conductive substrate, and the first cell region includes a first interconnection region of the one or more interconnection regions. Cutting the photovoltaic web may include cutting the cell regions into discrete photovoltaic cells. The photovoltaic web may be cut after of before the photoactive composition is scribed to create electrically isolated interconnection regions. In some embodiments, the photovoltaic module may be further (or partially) assembled as described below before being split or cut into individual cells.

In some embodiments of method 500, step 504 may be performed after step 506. For example, scribing through the photoactive composition may involve scribing through photoactive composition on one or more cell regions that have already been cut into discrete cells. In other embodiments, step 506 may be performed after step 504.

Method 500 may include a step 508 of preparing an interconnection tape including a conductive strip disposed on a dielectric strip. The interconnection tape may be prepared by electrodepositing a conductive material to form a conductive strip on a dielectric strip. The conductive strip may be electrodeposited copper. The dielectric strip may be an adhesive, or may be a polymer with an adhesive on each side of the polymer. The interconnection tape may be prepared in sheets or in rolls, each sheet or roll including multiple interconnection tapes. The roll or sheet of interconnection tapes may be split into individual reels or lengths of interconnection tape. The conductive strip of interconnection tape may include a conductive buss bar and a plurality of conductive fingers that may extend from the buss bar.

Method 500 may include a step 510 of applying the interconnection tape to the first cell region such that the conductive strip contacts the first interconnection region. Step 510 may involve applying a first conductive finger of the conductive strip to the first interconnection region, and applying a second conductive finger of the conductive strip to a second interconnection region of the one or more interconnection regions included in the first cell region. Step 510 may involve heat staking the interconnection tape to the plurality of interconnection regions to temporarily hold the interconnection tape in place.

In some embodiments, step 510 may be performed before step 506. For example, step 510 may involve applying the interconnection tape to the first cell region of the photovoltaic material corresponding to the first cell that may be subsequently cut into the first discrete cell.

In other embodiments, step 510 may be performed after step 506. For example, the interconnection tape may be applied to the first cell region after the first cell region has been cut from the photovoltaic material.

Method 500 may include a step 512 of electrically connecting the conductive strip to the top side of the conductive back sheet of the first cell region through the first interconnection region. The conductive fingers of the conductive strip may be electrically connected to the conductive back sheet by laser welding. Step 512 may involve converting the photovoltaic material of the interconnection regions into material having low ohmic resistance. The converted photovoltaic material may comingle with the conductive strip and/or the conductive back sheet to create an electrical connection.

In some embodiments, step 512 may be performed before step 506. For example, step 512 may involve electrically connecting the conductive strip to the conductive back sheet of the first cell region before the first and second cell regions are cut into the first and second discrete cells.

In other embodiments, step 510 may be performed after step 506. For example, the interconnection tape may be electrically connected to the conductive back sheet of the first cell region corresponding to the first discrete cell after the first and second cell regions have been cut into the first and second discrete cells.

Method 500 may include a step 514 of folding the interconnection tape to a folded position, the folded position corresponding to the conductive strip wrapped around the dielectric strip. Step 514 may involve placing the buss bar above photoactive composition between the first and second interconnection regions. Placing the buss bar may involve sandwiching the dielectric strip between the buss bar and the photoactive composition between the first and second interconnection regions.

In some embodiments, step 514 may be performed before step 506. For example, step 514 may involve folding the interconnection tape to the folded position on the first and second cell regions of the photovoltaic material, and step 506 may involve cutting the photovoltaic material and the interconnection tape in the folded position into the first and second discrete photovoltaic cells. In other embodiments, step 506 may be performed before step 514.

Method 500 may further comprise a step of holding the interconnection tape in the folded position by an adhesive included in the dielectric strip, which may involve adhering the adhesive of the dielectric strip to the photoactive material between the first and second interconnection regions. Adhering the adhesive to the photoactive material may involve substantially filling the one or more scribes that electrically isolate the first and second interconnection regions from the photoactive material between the first and second interconnection regions.

Method 500 may include a step 516 of preparing an optically transmissive front sheet including an embedded conductive wire pattern. Step 516 may include preparing an optically transmissive adhesive layer disposed on a bottom side of an optically transmissive substrate. The conductive wire pattern may have a thickness in a direction normal to the bottom side of the optically transmissive substrate. A majority of the thickness of the conductive wire pattern may be embedded in the optically transmissive adhesive layer.

Method 500 may include a step 518 of electrically interconnecting the first and second discrete cells by placing the conductive wire pattern in electrical contact with the photoactive composition of the second discrete cell (corresponding to the second cell region) and with the conductive strip that is electrically connected to the top side of the conductive back sheet of first discrete cell (corresponding to the first cell region). Step 518 may include placing photovoltaic cells on the bottom side of the optically transmissive substrate. The buss bar of the conductive strip applied to one cell may be electrically interconnected to the photoactive composition of a neighboring cell. Multiple neighboring photovoltaic cells may be connected in series.

Figure 21A:
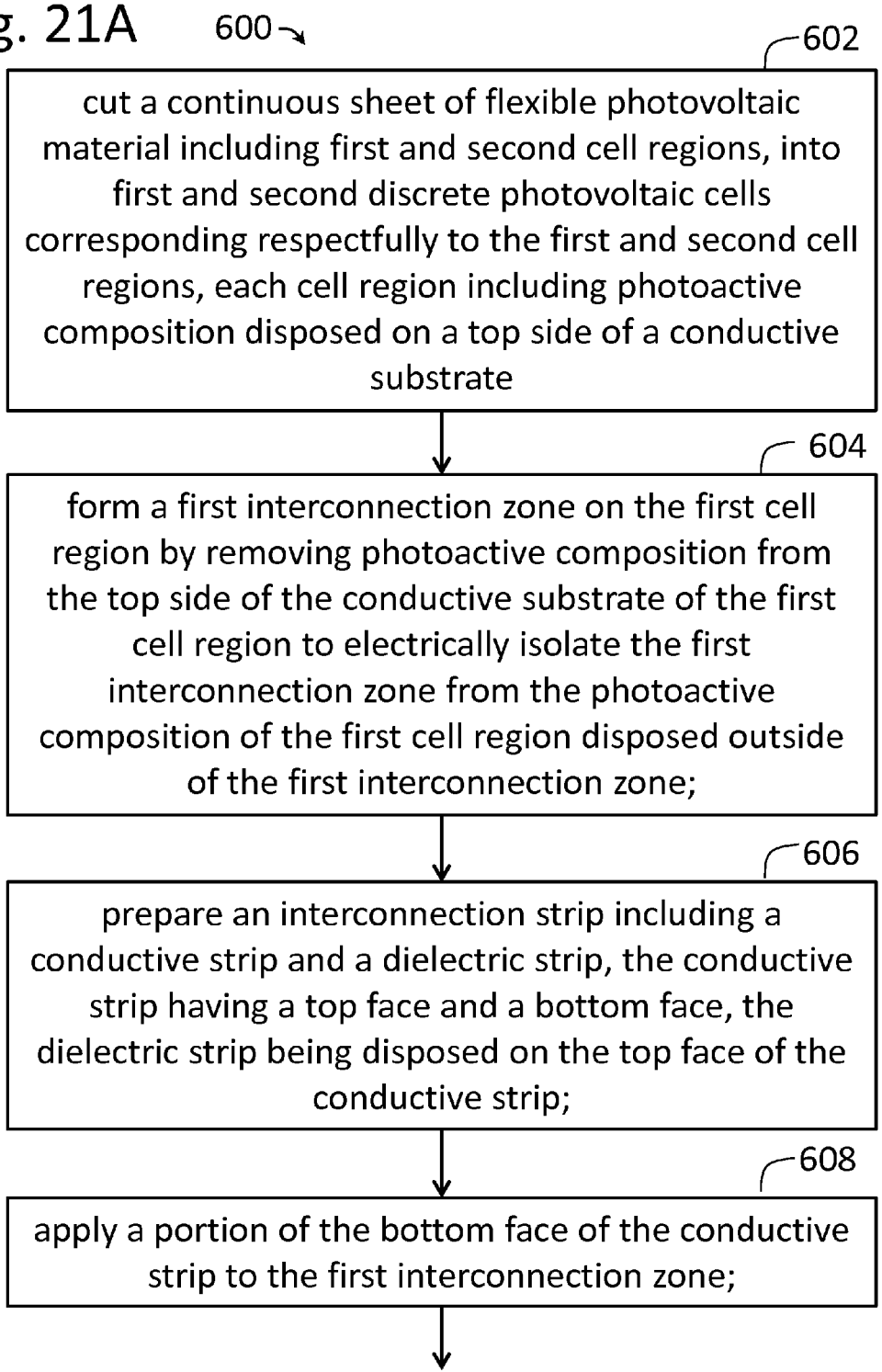

FIGS. 21A and 21B when viewed together depict a method, generally indicated at 600, of manufacturing a photovoltaic module, according to aspects of the present teachings.

Method 600 may include a step 602 of cutting a continuous sheet of flexible photovoltaic material including first and second cell regions, into first and second discrete photovoltaic cells. Each of the first and second cell regions may include photoactive composition disposed on a top side of a conductive substrate. The continuous sheet of flexible photovoltaic material may be from a roll or reel and may be referred to as a photovoltaic web. The photovoltaic web may include multiple cell regions, which may later be cut to form multiple discrete photovoltaic cells.

Method 600 may include a step 604 of forming a first interconnection zone on the first cell region by removing photoactive composition from the top side of the conductive substrate of the first cell region to electrically isolate the first interconnection zone from the photoactive composition of the first cell region disposed outside of the first interconnection zone. Photoactive composition may be removed by scribing through the photoactive composition down to the conductive substrate.

In some embodiments of method 600, step 604 may be performed before step 602. For example, removing the photoactive composition in step 604 may involve removing the photovoltaic material before the photovoltaic material is cut into the first and second discrete cells.

Method 600 may include a step 606 of preparing an interconnection strip including a conductive strip and a dielectric strip. The conductive strip may have a top face and a bottom face. The dielectric strip may be disposed on the top face of the conductive strip. The conductive strip may include a conductive buss bar and a plurality of conductive fingers extending from the conductive buss bar.

Method 600 may include a step 608 of applying a portion of the bottom face of the conductive strip to the first interconnection zone. The portion of the bottom face of the conductive strip may be one of the plurality of conductive fingers. The applied conductive strip and the interconnection zone of the cell or cell region of photovoltaic material may be heat staked to temporarily hold them in the applied position.

In some embodiments of method 600, step 608 may be performed prior to step 602. For example, applying the portion of the bottom face of the conductive strip to the first interconnection zone may involve applying the portion to the first interconnection zone before the photovoltaic material has been cut into first and second discrete cells.

In other embodiments, step 602 may be performed prior to step 610. For example, the first and second cell regions may be cut into the first and second discrete cells prior to the conductive strip being applied.

Method 600 may include a step 610 of electrically connecting the conductive strip to the top side of the conductive substrate of the first cell region through the first interconnection zone. Step 610 may involve laser welding the conductive strip to the top side of the conductive substrate of the first cell region through photoactive material in the first interconnection zone. The electrical connection of the conductive strip and the top side of the conductive substrate may involve the comingling of material, including the substrate, the conductive strip, and the photoactive material.

In some embodiments of method 600, step 610 may be performed before step 602. For example, electrically connecting the conductive strip to the conductive substrate of the first cell region through the first interconnection zone may involve electrically connecting the conductive strip to the conductive substrate of the first cell region before the first and second cell regions have been cut into the first and second discrete cells.

In other embodiments, step 602 may be performed before step 610. For example, the first and second cell regions may be cut into the first and second discrete cells before the conductive strip is electrically connected to the conductive substrate of the first cell region.

Method 600 may include a step 612 of penetrating the dielectric strip to expose a portion of the top face of the conductive strip. The top face of the conductive strip may be exposed by forming vias or penetrations in the dielectric strip. The penetration of the dielectric strip may allow for interconnection of the photoactive cell without requiring interconnection tape to be folded to expose the conductive strip.

Method 600 may include a step 614 of preparing an optically transmissive front sheet. The front sheet may include an embedded conductive wire grid. Step 614 may involve embedding one or more conductive wires in an adhesive layer to produce the embedded conductive wire grid. The adhesive layer may be disposed on a bottom side of an optically transmissive substrate. The adhesive layer may have a thickness in a direction normal to the bottom side of the optically transmissive substrate. The one or more conductive wires may have a thickness in the direction normal to the bottom side of the optically transmissive substrate. The thickness of the adhesive layer and the thickness of the one or more conductive wires may have the same order of magnitude.

Embedding the one or more conductive wires in the adhesive layer, in step 614 for example, may involve allowing a minority of the thickness of the one or more conductive wires to protrude from the adhesive layer opposite the optically transmissive substrate. The one or more wires of the conductive wire grid may be Cu wires coated with a conductive substantially non-oxidizing material to prevent high resistance oxide formation.

Method 600 may include a step 616 of electrically interconnecting the first and second discrete cells in series by placing the embedded conductive wire grid in electrical contact with the portion of the top face of the conductive strip and with the photoactive composition of the second discrete cell (corresponding to the second cell region). The embedded conductive wire grid may contact the conductive strip by way of the vias or penetrations in the dielectric strip.

Method 600 may further comprise a step of attaching a backsheet with an integrated bypass diode, to bottom sides of the conductive substrates of the first and second discrete cells.

Figure 22B:
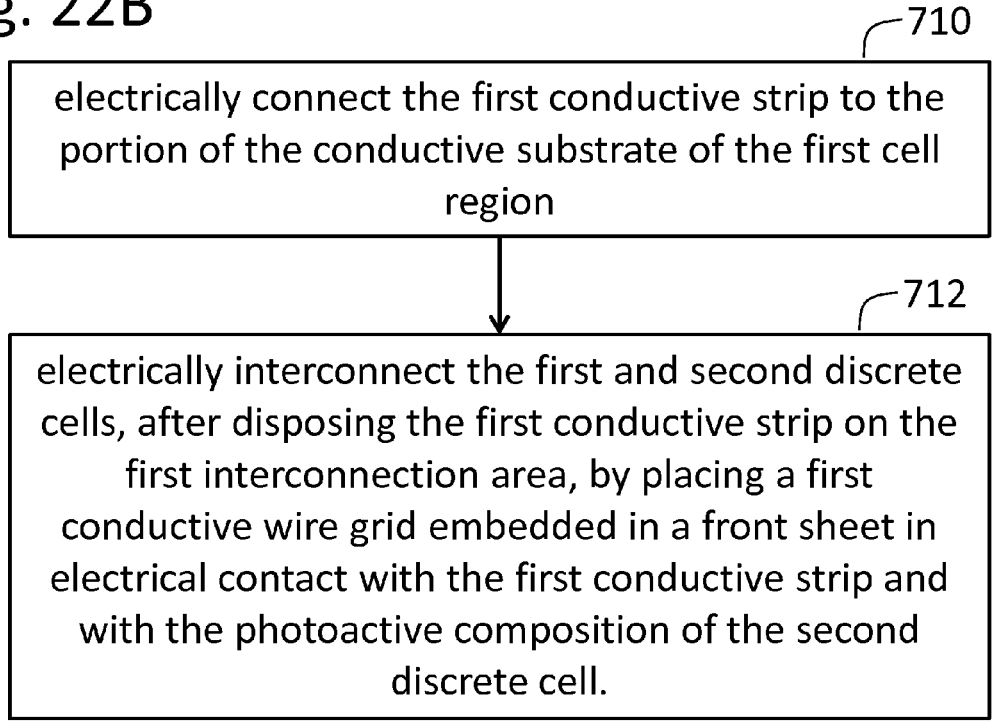

FIGS. 22A and 22B when viewed together depict a method, generally indicated at 700, of manufacturing a photovoltaic module, according to aspects of the present teachings.

Method 700 may comprise a step 702 of applying a photoactive composition to a conductive substrate to produce a continuous sheet of photovoltaic material including first and second cell regions. The continuous sheet of flexible photovoltaic material may be a roll or a reel of photovoltaic material, which may be generally referred to as a photovoltaic "web." The photovoltaic web may include a plurality of cell regions in addition to the first and second cell regions.

Method 700 may comprise a step 704 of cutting the photovoltaic material into first and second discrete photovoltaic cells respectively corresponding to the first and second cell regions. Each of the first and second cell regions may include photoactive composition disposed on a top side of a portion of the conductive substrate. Step 704 may involve cutting the cell regions of the photovoltaic web to form individual photovoltaic cells. The photovoltaic web may be cut after applying the photoactive composition to the substrate. Alternatively, the photovoltaic web may be cut into individual cells after the photovoltaic module has been further assembled as described below, which assembly may take place at each cell region of the photovoltaic web as opposed to individually cut photovoltaic cells.

Method 700 may comprise a step 706 of creating a first interconnection area on the first cell region by removing a portion of the photoactive composition from the top side of the portion of the conductive substrate of the first cell region to electrically isolate the first interconnection area from the photoactive composition of the first cell region disposed outside of the first interconnection area. Step 706 may involve scribing away the photoactive composition. A plurality of interconnection areas may be created in a roll-to-roll process by scribing the cell regions of a photovoltaic web. In some embodiments of method 700, step 706 may come before step 704.

For example, creating a first interconnection area may involve removing a portion of the photoactive composition from the cell region of the photovoltaic web before the photoactive material is cut into individual cells.

Method 700 may comprise a step 708 of disposing a first conductive strip on the first interconnection area. The conductive strip may have a top face and a bottom face. The conductive strip may include a conductive buss bar and a plurality of conductive fingers extending from the buss bar. The bottom face of a conductive finger may be disposed on the first interconnection area. The interconnection area and the conductive strip may be heat staked to temporarily maintain their position one with another. The conductive strip may also include a dielectric strip disposed on its top face, which may include an adhesive.

In some embodiments of method 700, step 700 may come before step 704. For example, disposing a first conductive strip on the first interconnection area may involve disposing a first conductive strip on the interconnection area of the first cell region of the photovoltaic material.

Method 700 may comprise a step 710 of electrically connecting the first conductive strip to the portion of the conductive substrate of the first cell region. Step 710 may involve laser welding the first conductive strip to the top side of the portion of the conductive substrate of the first cell region through photoactive material disposed inside the first interconnection area.

Method 700 may comprise a step 712 of electrically interconnecting the first and second discrete cells, after disposing the first conductive strip on the first interconnection area, by placing a first conductive wire grid embedded in a front sheet in electrical contact with the first conductive strip and with the photoactive composition of the second discrete cell. As described above, the second discrete cell corresponds to the second cell region, thus the photoactive composition of the second cell region may be described as the photoactive composition of the second discrete cell. Step 712 may electrically connect the first and second discrete cells in series.

Step 712 may involve contacting the first conductive strip and the photoactive composition of the second discrete cell with a bottom side of the front sheet. Wires of the first conductive wire grid may have a thickness in a direction normal to the bottom side of the front sheet. At least 25% of the thickness of the wires may extend through the bottom side of the front sheet. The bottom side of the front sheet may be a layer of adhesive.

Method 700 may further comprise a step of creating a second interconnection area on the second cell region by removing a portion of the photoactive composition from the top side of the portion of the conductive substrate of the second cell region to electrically isolate the second interconnection area from the photoactive composition of the second cell disposed outside of the second interconnection area.

Method 700 may further comprise a step of disposing a second conductive strip on the second interconnection area.

Method 700 may further comprise a step of electrically connecting the second conductive strip to the portion of the conductive substrate of the second cell region.

Method 700 may further comprise a step of electrically interconnecting the second discrete cell to a third discrete photovoltaic cell, after disposing the second conductive strip on the second interconnection area, by placing a second conductive wire grid that is embedded in and protruding from the bottom side of the front sheet, in electrical contact with the second conductive strip and with photoactive composition of the third discrete cell.

Method 700 may further comprise adhering a conductive substrate of the third discrete cell and the portions of the conductive substrate of the first and second discrete cells to a backsheet including a first bypass diode electrically connected to a second bypass diode by a conductive ribbon. Each bypass diode may have an anode portion and a diode portion. For example, the anode portion of the first bypass diode may be electrically connected to the conductive substrate of the first cell, and the cathode portion of the first bypass diode may be electrically connected to the conductive substrate of the second cell. Because the photoactive material of the second discrete cell is electrically connected to the conductive substrate of the first discrete cell, as described above, the first bypass diode may be effectively connected to both the photoactive material and the conductive substrate of the second discrete cell, to act as a bypass. First and second bypass diodes may form part of a bypass string with conductive ribbon. One or more bypass strings may be in electrical contact with the conductive substrates of a string of photovoltaic cells, effectively positioning a diode between the conductive substrate and the photoactive material of each cell.

What is claimed is:

1. A method of manufacturing a photovoltaic module, comprising: applying a photoactive composition to a conductive substrate to produce a continuous sheet of flexible photovoltaic material including first and second cell regions; scribing through the photoactive composition to electrically isolate one or more interconnection regions disposed on the top side of the conductive substrate from the photoactive composition surrounding the one or more interconnection regions, such that each interconnection region includes a respective isolated portion of the photoactive composition; cutting the photovoltaic material into first and second discrete photovoltaic cells corresponding respectively to the first and second cell regions, each cell region including photoactive composition disposed on a top side of a conductive back sheet, wherein each conductive back sheet is a portion of the conductive substrate, and the first cell region includes a first interconnection region of the one or more interconnection regions; preparing interconnection tape including a conductive strip disposed on a dielectric strip; applying the interconnection tape to the first cell region such that the conductive strip contacts the first interconnection region; electrically connecting the conductive strip to the top side of the conductive back sheet of the first cell region through the isolated portion of photoactive composition of the first interconnection region; folding the interconnection tape to a folded position, the folded position corresponding to the conductive strip wrapped around the dielectric strip; preparing an optically transmissive front sheet including an embedded conductive wire pattern; and electrically interconnecting the first and second discrete cells by placing the conductive wire pattern in electrical contact with the photoactive composition of the second discrete cell and with the conductive strip that is electrically connected to the top side of the conductive back sheet of the first discrete cell.

2. The method of claim 1, wherein applying the interconnection tape to the first cell region involves applying a first conductive finger of the conductive strip to the first interconnection region, and applying a second conductive finger of the conductive strip to a second interconnection region of the one or more interconnection regions included in the first cell region, the conductive strip including a buss bar from which the first and second conductive fingers extend, and wherein folding the interconnection tape involves placing the buss bar above photoactive composition between the first and second interconnection regions.

3. The method of claim 2, wherein placing the buss bar involves sandwiching the dielectric strip between the buss bar and the photoactive composition between the first and second interconnection regions.

4. The method of claim 3, further comprising holding the interconnection tape in the folded position by an adhesive included in the dielectric strip.

5. The method of claim 4, wherein applying the interconnection tape to the first cell region involves adhering the adhesive of the dielectric strip to the photoactive material between the first and second interconnection regions.

6. The method of claim 5, wherein adhering the adhesive to the photoactive material involves substantially filling the one or more scribes that electrically isolate the first and second interconnection regions from the photoactive material between the first and second interconnection regions.

7. The method of claim 1, wherein preparing the front sheet includes preparing an optically transmissive adhesive layer disposed on a bottom side of an optically transmissive substrate, the conductive wire pattern having a thickness in a direction normal to the bottom side of the optically transmissive substrate, a majority of the thickness of the conductive wire pattern being embedded in the optically transmissive adhesive layer.

8. A method of manufacturing a photovoltaic module, comprising: cutting a continuous sheet of flexible photovoltaic material including first and second cell regions into first and second discrete photovoltaic cells corresponding respectively to the first and second cell regions, each cell region including photoactive composition disposed on a top side of a conductive substrate; forming a first interconnection zone on the first cell region by removing photoactive composition from the top side of the conductive substrate of the first cell region to electrically isolate the first interconnection zone from the photoactive composition of the first cell region disposed outside of the first interconnection zone, such that the first interconnection zone includes an isolated portion of the photoactive composition; preparing an interconnection strip including a conductive strip and a dielectric strip, the conductive strip having a top face and a bottom face, the dielectric strip being disposed on the top face of the conductive strip; applying a portion of the bottom face of the conductive strip to the first interconnection zone; electrically connecting the conductive strip to the top side of the conductive substrate of the first cell region through the isolated portion of photoactive composition of the first interconnection zone; penetrating the dielectric strip to expose a portion of the top face of the conductive strip; preparing an optically transmissive front sheet, the front sheet including an embedded conductive wire grid; and electrically interconnecting the first and second discrete cells in series by placing the embedded conductive wire grid in electrical contact with the portion of the top face of the conductive strip and with the photoactive composition of the second discrete cell.

9. The method of claim 8, wherein electrically connecting the conductive strip to the top side of the conductive substrate of the first cell region involves laser welding the conductive strip to the top side of the conductive substrate of the first cell region through photoactive material in the first interconnection zone.

10. The method of claim 8, wherein preparing the front sheet involves embedding one or more conductive wires in an adhesive layer to produce the embedded conductive wire grid, the adhesive layer being disposed on a bottom side of an optically transmissive substrate, the adhesive layer having a thickness in a direction normal to the bottom side of the optically transmissive substrate, the one or more conductive wires having a thickness in the direction normal to the bottom side of the optically transmissive substrate, the thickness of the adhesive layer and the thickness of the one or more conductive wires having the same order of magnitude.

11. The method of claim 10, wherein embedding the one or more conductive wires in the adhesive layer involves allowing a minority of the thickness of the one or more conductive wires to protrude from the adhesive layer opposite the optically transmissive substrate.

12. The method of claim 8, wherein one or more wires of the conductive wire grid are Cu coated with a conductive substantially non-oxidizing material to prevent high resistance oxide formation.

13. The method of claim 8, further comprising attaching a backsheet with an integrated bypass diode, to bottom sides of the conductive substrates of the first and second discrete cells.

14. A method of manufacturing a photovoltaic module, comprising: applying a photoactive composition to a conductive substrate to produce a continuous sheet of photovoltaic material including first and second cell regions; cutting the photovoltaic material into first and second discrete photovoltaic cells respectively corresponding to the first and second cell regions, each cell region including photoactive composition disposed on a top side of a portion of the conductive substrate; creating a first interconnection area on the first cell region by removing a portion of the photoactive composition from the top side of the portion of the conductive substrate of the first cell region to electrically isolate the first interconnection area from the photoactive composition of the first cell region disposed outside of the first interconnection area, such that the first interconnection area includes an isolated portion of the photoactive composition; disposing a first conductive strip on the first interconnection area; electrically connecting the first conductive strip to the portion of the conductive substrate of the first cell region through the isolated portion of the photoactive composition; and electrically interconnecting the first and second discrete cells, after disposing the first conductive strip on the first interconnection area, by placing a first conductive wire grid embedded in a front sheet in electrical contact with the first conductive strip and with the photoactive composition of the second discrete cell.

15. The method of claim 14, wherein electrically interconnecting the first and second discrete cells electrically connects the first and second discrete cells in series.

16. The method of claim 14, wherein electrically connecting the first conductive strip involves laser welding the first conductive strip to the top side of the portion of the conductive substrate of the first cell region through photoactive material disposed inside the first interconnection area.

17. The method of claim 14, wherein electrically interconnecting the first and second discrete cells involves contacting the first conductive strip and the photoactive composition of the second discrete cell with a bottom side of the front sheet, wires of the first conductive wire grid having a thickness in a direction normal to the bottom side of the front sheet, at least 25% of the thickness of the wires extending through the bottom side of the front sheet.

18. The method of claim 17, wherein the bottom side of the front sheet is a layer of adhesive.

19. The method of claim 18, further comprising: creating a second interconnection area on the second cell region by removing a portion of the photoactive composition from the top side of the portion of the conductive substrate of the second cell region to electrically isolate the second interconnection area from the photoactive composition of the second cell region disposed outside of the second interconnection area; disposing a second conductive strip on the second interconnection area; electrically connecting the second conductive strip to the portion of the conductive substrate of the second cell region; and electrically interconnecting the second discrete cell that corresponds to the second cell region to a third discrete photovoltaic cell, after disposing the second conductive strip on the second interconnection area, by placing a second conductive wire grid that is embedded in and protruding from the bottom side of the front sheet, in electrical contact with the second conductive strip and with photoactive composition of the third discrete cell.

20. The method of claim 19, further comprising adhering a conductive substrate of the third discrete cell and the portions of the conductive substrate of the first and second discrete cells to a backsheet including a first bypass diode electrically connected to a second bypass diode by a conductive ribbon.

* * * * *